US007282321B2

(12) United States Patent
Mitsumoto et al.

(10) Patent No.: US 7,282,321 B2

(45) Date of Patent: Oct. 16, 2007

(54) LITHOGRAPHIC PRINTING METHOD AND PRESENSITIZED PLATE

(75) Inventors: Tomoyoshi Mitsumoto, Shizuoka (JP); Ippei Nakamura, Shizuoka (JP); Naonori Makino, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 109 days.

(21) Appl. No.: 10/809,323

(22) Filed: Mar. 26, 2004

(65) Prior Publication Data

US 2004/0197701 A1 Oct. 7, 2004

(30) Foreign Application Priority Data

Mar. 26, 2003 (JP) ............................ 2003-085166
Sep. 19, 2003 (JP) ............................ 2003-327659
Sep. 30, 2003 (JP) ............................ 2003-341197

(51) Int. Cl.
*G03C 1/76* (2006.01)
*G03C 1/93* (2006.01)
*G03F 7/11* (2006.01)

(52) U.S. Cl. ............................. 430/271.1; 430/275.1; 430/276.1; 430/277.1; 430/278.1; 430/279.1; 430/280.1; 430/281.1; 430/944; 430/302

(58) Field of Classification Search ............ 430/271.1, 430/302, 944, 926, 281.1, 945
See application file for complete search history.

(56) References Cited

U.S. PATENT DOCUMENTS

| | | | | |
|---|---|---|---|---|
| 4,365,018 A * | 12/1982 | Crutchfield et al. | ........ | 430/139 |
| 6,096,481 A | 8/2000 | Vermeersch et al. | ........ | 430/302 |
| 6,599,674 B1 * | 7/2003 | Kawamura | ............... | 430/270.1 |
| 6,740,464 B2 | 5/2004 | Maemoto | | |
| 6,770,422 B2 | 8/2004 | Nakamura et al. | | |
| 6,797,449 B2 | 9/2004 | Nakamura et al. | | |
| 2002/0102488 A1 * | 8/2002 | Yanaka et al. | .............. | 430/138 |
| 2002/0177074 A1 * | 11/2002 | Hoshi et al. | ............. | 430/281.1 |
| 2003/0054288 A1 * | 3/2003 | Shimada et al. | ......... | 430/270.1 |

FOREIGN PATENT DOCUMENTS

| | | | |
|---|---|---|---|
| CN | 1309330 | A | 8/2001 |
| CN | 1334490 | A | 2/2002 |
| CN | 1372166 | A | 10/2002 |
| EP | 1 096 315 | A1 | 5/2001 |
| EP | 1 176 007 | A2 | 1/2002 |
| EP | 1 223 196 | A2 | 7/2002 |
| EP | 1 334 823 | A2 | 8/2003 |
| JP | 2938397 | | 6/1999 |
| JP | 2001-277740 | A | 10/2001 |
| JP | 2002-287334 | A | 10/2002 |

* cited by examiner

*Primary Examiner*—Sin Lee
(74) *Attorney, Agent, or Firm*—Birch, Stewart, Kolasch & Birch, LLP

(57) ABSTRACT

Disclosed is a presensitized plate composed of a support having thereon an image recording layer which includes:

an infrared absorber (A) that is a cyanine dye having at least one fused ring composed of a nitrogen-containing heterocycle in combination with an aromatic ring or a second heterocycle, and having on the aromatic ring or second heterocycle an electron-withdrawing group or a heavy atom-containing group, a radical generator (B), and a radical-polymerizable compound (C), and which is removable with printing ink and/or dampening water.

The presensitized of the present invention can be imaged with an infrared light-emitting laser to directly record an image from digital data on a computer or the like and is then subjected to on-machine development without carrying out a development step, which is capable of providing a large number of good impressions with a practical amount of energy.

3 Claims, No Drawings

LITHOGRAPHIC PRINTING METHOD AND PRESENSITIZED PLATE

This Nonprovisional application claims priority under 35 U.S.C. § 119(a) on Patent Application No(s). 2003-085166, 2003-327659 and 2003-341197 filed in Japan on Mar. 26, 2003, Sep. 19, 2003 and Sep. 30, 2003, respectively, the entire contents of which are hereby incorporated by reference.

BACKGROUND OF THE INVENTION

1. Field of the Invention

The present invention relates to a presensitized plate for lithographic printing and to a lithographic printing method which uses the presensitized plate. More specifically, the present invention relates to a presensitized plate which, by being exposed to an infrared laser scanned over it based on digital signals from a computer or the like, can be made directly into a lithographic printing plate, and relates also to a lithographic printing method in which the foregoing presensitized plate is directly developed and printed on a printing press without passing through a development step.

2. Description of the Related Art

Lithographic printing plates are generally composed of oleophilic image areas which are receptive to ink during the printing operation and hydrophilic non-image areas which are receptive to dampening water. Lithographic printing is a process that utilizes the mutual repellence between water and oil-based inks by having the oleophilic image areas of the plate serve as ink-receptive areas and having the hydrophilic non-image areas serve as water-receptive areas (non-ink receptive areas), thus creating differences in the ability of ink to adhere to the surface of the plate and allowing the ink to be deposited only in the oleophilic image areas. The ink that has been selectively deposited on the plate is then transferred to a printing substrate such as paper.

Presensitized plates composed of an oleophilic photosensitive resin layer (image recording layer) on a hydrophilic support are widely used to make such lithographic printing plates. Generally, the lithographic printing plate is obtained by a platemaking process in which the presensitized plate is exposed to light through an original on lith film or the like. Next, the image recording layer is left intact in image areas but is dissolved and removed with an alkaline developer or an organic solvent in non-image areas, thereby revealing the surface of the hydrophilic support.

Platemaking operations with prior-art presensitized plates have required, following light exposure, a step in which the non-image areas are dissolved and removed, typically with a developer suitable for the image recording layer. One challenge has been how to simplify or eliminate altogether such wet development carried out as an ancillary operation. In particular, the treatment of wastewater discharged in connection with wet treatment has become a major issue throughout the industry owing to concerns over the global environment, making the need for a solution to the above problem increasingly acute.

One simple platemaking process that has been devised in response to the above need is referred to as "on-machine development." This involves the use of an image recording layer which allows non-image areas of the presensitized plate to be removed in an ordinary printing operation. Following exposure of the presensitized plate to light, the non-image areas are removed on the printing press, yielding a lithographic printing plate.

Exemplary on-machine development methods include techniques that use a presensitized plate having an image recording layer which can be dissolved or dispersed in dampening water, ink solvent or an emulsion of dampening water and ink; techniques that mechanically remove the image recording layer by bringing it into contact with the impression cylinder or blanket cylinder on the printing press; and techniques in which cohesive forces within the image recording layer or adhesive forces between the image recording layer and the support are weakened by the penetration of, for example, dampening water or ink solvent, following which the image recording layer is mechanically removed by contact with the impression cylinder or blanket cylinder.

In this specification, unless noted otherwise, "development step" refers to an operation in which, using an apparatus other than a printing press (typically an automated processor), the areas of the presensitized plate which have not been exposed with an infrared laser are brought into contact with a liquid (typically an alkaline developer) and removed, thereby revealing the surface of the hydrophilic support. Likewise, "on-machine development" refers herein to a process and operation in which, using a printing press, areas of the presensitized plate which have not been exposed with an infrared laser are brought into contact with a liquid (typically dampening water for printing) and removed, thus revealing the surface of the hydrophilic support.

However, when use is made of a prior-art image recording layer that utilizes ultraviolet light or visible light to record an image, because the image recording layer is not fixed even after exposure to light, it has been necessary to resort to a cumbersome process such as storing the exposed presensitized plate in a completely light-shielded state or under constant-temperature conditions before it is mounted on the printing press.

In recent years, the use of digitizing technology to electronically process, store and output image information using computers has become very widespread, and various new image output systems adapted to such digitizing technology have come into use. Most notably, these trends have given rise to computer-to-plate technology, in which digitized image data is carried on a highly convergent beam of radiation such as laser light which is scanned over a presensitized plate to expose it, thus enabling the direct production of a lithographic printing plate without relying on the use of lith film. One major technical challenge has been the development of presensitized plates suitable for computer-to-plate technology.

As already noted, the desire today for simpler platemaking operations which either involve dry development or are development-free has grown increasingly acute, both on account of concerns over the global environment and for compatibility with digitization.

Given the availability today of inexpensive high-output lasers such as semiconductor lasers and YAG lasers, methods which employ these high-output lasers as the image recording means show much promise because they involve the production of lithographic printing plates by scanning-type exposure which can readily be integrated with digitizing technology.

In prior-art platemaking processes, the imagewise exposure of a photosensitive presensitized plate is carried out at a low to moderate illuminance, and the image is recorded by imagewise changes in physical properties brought about by photochemical reactions within the image recording layer. By contrast, in methods that use the high-output lasers mentioned above, the region to be exposed is irradiated with a large amount of light energy for a very short period of time, the light energy is efficiently converted into thermal energy, and the heat triggers chemical changes, phase changes and changes in form or structure within the image recording layer. Such changes are used to record the image. Thus, the image information is input by light energy such as laser light, but the image is recorded using both light energy and reactions triggered by thermal energy. Recording techniques which make use of heat generated by such high power density exposure are generally referred to as "heat mode recording," and the conversion of light energy to heat energy is generally called "photothermal conversion."

The major advantages of platemaking methods that use heat mode recording are that the image recording layer is not sensitive to light at ordinary levels of illuminance such as indoor lighting, and that the image recorded with high-illuminance exposure does not need to be fixed. That is, the presensitized plates used in heat mode recording are not sensitive to indoor light prior to exposure and do not require the image to be fixed following exposure. It is therefore possible to have a printing system in which, for example, an image recording layer that can be rendered insoluble or soluble by exposure to light from a high-powered laser-is imagewise exposed, and the exposed layer is subsequently rendered into a lithographic printing plate in a platemaking operation carried out by on-machine development. In such a system, following exposure, the image incurs no effects even when exposed to ambient indoor light. Accordingly, there is some reason to believe that by using heat mode recording, presensitized plates suitable for use in on-machine development may be obtained.

Remarkable advances have been made recently in laser technology. In particular, it has become possible to easily acquire small, high-output semiconductor lasers and solid lasers which emit infrared light at wavelengths of 760 to 1200 nm. Such infrared lasers are extremely useful as recording light sources when making printing plates directly from digital data on a computer or the like.

However, in most photosensitive recording materials of practical use as image recording layers, the photosensitive wavelength is in the visible light range at wavelengths of 760 nm or less. Infrared lasers cannot be used for recording images on such materials. Accordingly, there exists a need for materials on which images can be recorded using infrared lasers.

In response to this need, JP 2938397 B (the term "JP XXXXXXX B" as used herein means a "Japanese patent") describes a presensitized plate in which a hydrophilic support has provided thereon an image-forming layer composed of hydrophilic binders with hydrophobic thermoplastic polymer particles dispersed therein. JP 2938397 B describes the exposure of a presensitized plate using an infrared laser and the ensuing coalescence of hydrophobic thermoplastic polymer particles under the effect of heat to form an image, and how the plate can then be mounted onto the cylinder of a printing press and on-machine development carried out with dampening water and/or ink.

Although methods in which an image is formed in this way by the coalescence of small particles using thermal fusion alone exhibit good on-machine development properties, the exposed plate has a very low image strength (adhesion to the support) and thus a short press life.

JP 2002-287334 A (the term "JP XX-XXXXXX A" as used herein means an "unexamined published Japanese patent application") describes a presensitized plate composed of a support on which has been provided a photosensitive layer containing an infrared absorber, a radical polymerization initiator and a polymerizable compound.

Methods that use polymerization/crosslinking reactions in this way have a relatively good image strength because of the high chemical bond density in the image areas. However, because both the press life and the polymerization efficiency (sensitivity) fall short of what is needed for practical purposes, such plates have yet to see commercial use.

SUMMARY OF THE PRESENT INVENTION

It is therefore one object of the present invention to provide a lithographic printing method in which a presensitized plate that can be imaged with an infrared light-emitting laser is used to directly record an image from digital data on a computer or the like and is then subjected to on-machine development without carrying out a development step (a wet development step using an alkaline developer), which is capable of providing a large number of good impressions with a practical amount of energy. Another object of the present invention is to provide presensitized plates which can be used in the lithographic printing method.

After extensively studying the constituents of negative-type image recording materials which can be used as the image recording layer in presensitized plates for lithographic printing, the inventors have discovered that the above objects can be achieved by using an image recording layer which includes an infrared absorber that is a cyanine dye having a specific partial structure. This discovery led to the first aspect of the present invention.

In the course of these same investigations, the inventors have also found that the foregoing objects can be achieved by using an image recording layer which includes an infrared absorber having a specific oxidation potential. This discovery led to a second aspect of the present invention.

Accordingly, the present invention provides the following presensitized plate (i) to (vi) and lithographic printing method (vii) to (ix).

(i) A presensitized plate composed of a support having thereon an image recording layer which includes:

an infrared absorber (A) that is a cyanine dye having at least one fused ring composed of a nitrogen-containing heterocycle in combination with an aromatic ring or a second heterocycle, and having on the aromatic ring or second heterocycle an electron-withdrawing group or a heavy atom-containing group, a radical generator (B), and a radical-polymerizable compound (C), and which is removable with printing ink and/or dampening water.

(ii) The presensitized plate according to the above (i), wherein the infrared absorber (A) is a compound of formula (1) below.

(1)

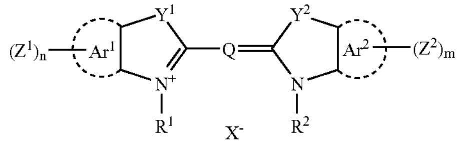

(In the formula, $R^1$ and $R^2$ are each independently a hydrocarbon group of up to 20 carbons which may be substituted. $Ar^1$ and $Ar^2$ are each independently an aromatic hydrocarbon group or a heterocyclic group which may be substituted. $y^1$ and $y^2$ are each independently a sulfur atom, an oxygen atom, a selenium atom, a dialkylmethylene group of up to 12 carbons or a —CH═CH— group. $Z^1$ and $Z^2$ are each substituents selected from the group consisting of hydrocarbon groups, oxy groups, electron-withdrawing groups and heavy atom-containing groups, at least one of $Z^1$ and $Z^2$ being an electron-withdrawing group or a heavy atom-containing group. The letters n and m each represent 0 or a higher integer, with the proviso that the sum of n and m is at least 1.

Q is a pentamethine group or a heptamethine group which may be substituted with a member selected from the group consisting of alkoxy, aryloxy, alkylthio, arylthio, dialkylamino, diarylamino, halogen atoms, alkyl, aralkyl, cycloalkyl, aryl, oxy, iminium bases and substituents of formula (2) below; or may have a cyclohexene, cyclopentene or cyclobutene ring containing three connected methine chains.

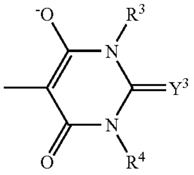

(2)

(In the formula, $R^3$ and $R^4$ are each independently a hydrogen atom, an alkyl of 1 to 8 carbons or an aryl of 6 to 10 carbons; and $y^3$ is an oxygen atom or a sulfur atom.)

$X^-$ is a counteranion that exists in cases where charge neutralization is required.)

(iii) A presensitized plate composed of a support having thereon an image recording layer which includes:

an infrared absorber (A) having an oxidation potential of at most 0.45 V (vs. SCE), a radical generator (B), and a radical-polymerizable compound (C), and which is removable with printing ink and/or dampening water.

(iv) The presensitized plate according to the above (iii), wherein the support has thereon, in order, an undercoat layer containing a compound having a polymerizable group on the molecule, and the image recording layer.

(v) The presensitized plate according to the above (iv), wherein the compound having a polymerizable group on the molecule also has on the molecule an ethylene oxide group.

(vi) The presensitized plate according to the above (iv), wherein the compound having a polymerizable group on the molecule also has on the molecule a support-adsorbable group.

(vii) The presensitized plate according to any one of the above (i) to (vi), wherein at least some of the infrared absorber (A), radical generator (B) and radical-polymerizable compound (C) is microencapsulated.

(viii) A lithographic printing method which includes the steps of imagewise exposing with an infrared laser the presensitized plate according to any one of the above (i) to (vii) which has the image recording layer that is infrared imageable, supplying an aqueous component and an oil-based ink to the exposed plate so as to remove unexposed areas of the image recording layer, and printing.

(ix) The lithographic printing method according to the above (viii), wherein the presensitized plate is mounted on a printing press prior to the imagewise exposure with an infrared laser.

(x) The lithographic printing method according to the above (viii), wherein the presensitized plate is mounted on a printing press following imagewise exposure with an infrared laser and before the supply of aqueous components and oil-based ink.

The presensitized plate of the first and second aspects of the present invention (hereinafter simply referred also to as the "presensitized plate of the present invention") has very long press life.

The lithographic printing method of the first and second aspects of the present invention (hereinafter simply referred also to as the "lithographic printing method of the present invention") enable a large number of good impressions to be obtained with a practical amount of energy when a presensitized plate which is imageable with an infrared-emitting laser is used to directly record an image from digital data on a computer or the like, and the laser-imaged plate is developed on a printing press without passing through a development step.

The mechanisms underlying the operation of the first aspect of the present invention are not fully understood. Apparently, when a cyanine dye having at least one fused ring composed of a nitrogen-containing heterocycle in combination with an aromatic ring or a second heterocycle and having on the aromatic ring or second heterocycle an electron-withdrawing group is used as the infrared absorber in the image recording layer of the presensitized plate, the polymerization reaction by the radical polymerizable compound proceeds rapidly, forming a durable image recording layer and thus improving the press-life of the plate. This is most likely due to accelerated polymerization of the radical-polymerizable compound for the following reasons.

(1) The electron-withdrawing group increases the ionization potential of the cyanine dye. As a result, in addition to ordinary decomposition of the initiator by photothermal conversion, interactions of some sort readily arise between the excited state of the dye during infrared irradiation and the initiator.

(2) The probability of generating radicals increases due to the reaction of the infrared absorber itself.

Also, the use of a cyanine dye having at least one fused ring composed of a nitrogen-containing heterocycle in combination with an aromatic ring or a second heterocycle and having on the aromatic ring or second heterocycle a heavy atom-containing group as the infrared absorber in the image recording layer of the presensitized plate apparently enables the polymerizing reaction by the radical-polymerizable compound to proceed rapidly so as to form a durable image recording layer having an improved press life. A likely explanation is that, because the infrared absorber readily forms a triplet excitation state during infrared irradiation, the triplet excitation state most likely inactivates polymerization-inhibiting dissolved oxygen present in the layer. In addition, the triplet excitation state of the infrared absorber and the radical generator probably interact in some way, accelerating decomposition of the radical generator.

The mechanisms underlying the operation of the present invention in the second aspect of the present invention also are not fully understood. Apparently, the use of an infrared absorber having a low oxidation potential promotes decomposition of the radical generator, so that polymerization of the radical-polymerizable compound proceeds rapidly, forming a durable image recording layer and thus improving the press life of the plate. This is presumably because of the good donor properties of the infrared absorber having a low oxidation potential. That is, in addition to ordinary decomposition of the radical generator by photothermal conversion, the improved donor properties of the infrared absorber appear to facilitate the formation of an intermediate which is composed of the infrared absorber and the radical generator and is believed to play a role in the mechanism of radical generator decomposition.

DETAILED DESCRIPTION OF THE PRESENT INVENTION

The present invention is described more fully below.

Presensitized Plate

Image Recording Layer:

The presensitized plate of the first aspect of the present invention has, on a support, an image recording layer which includes an infrared absorber (A) that is a cyanine dye having at least one fused ring composed of a nitrogen-containing heterocycle in combination with an aromatic ring or a second heterocycle, and having on the aromatic ring or second heterocycle an electron-withdrawing group or a heavy atom-containing group, a radical generator (B), and a radical-polymerizable compound (C), and which is removable with printing ink and/or dampening water. The presensitized plate of the second aspect of the present invention has, on a support, an image recording layer which includes an infrared absorber (A) having an oxidation potential of at most 0.45 V (vs. SCE), a radical generator (B), and a radical-polymerizable compound (C), and which is removable with printing ink and/or dampening water. When these presensitized plates are irradiated with infrared light, the exposed areas of the image recording layer cure, forming hydrophobic (oleophilic) regions. At the onset of printing, the unexposed areas are rapidly removed from the support by dampening water, ink or an emulsion of dampening water and ink. That is, the image recording layer is a layer which can be removed with printing ink and/or dampening water.

Each constituent of the image recording layer is described below.

Infrared Absorber (A):

The infrared absorber (A) used in the first aspect of the present invention is a cyanine dye having at least one fused ring composed of a nitrogen-containing heterocycle in combination with an aromatic ring or a second heterocycle, and having on the aromatic ring or second heterocycle an electron-withdrawing group or a heavy atom-containing group. The infrared absorber (A) used in the second aspect of the present invention is an infrared absorber having an oxidation potential of at most 0.45 V (vs. SCE). Infrared absorbers which are cyanine dyes having at least one fused ring composed of a nitrogen-containing heterocycle in combination with an aromatic ring or a second heterocycle and having on the aromatic ring or second heterocycle an electron-withdrawing group or a heavy atom-containing group, and which have an oxidation potential of at most 0.45 V (vs. SCE) can be advantageously used in both the first and second aspects of the present invention.

The infrared absorber used in the first aspect of the present invention is:

a cyanine dye (A-1) having at least one fused ring composed of a nitrogen-containing heterocycle in combination with an aromatic ring or a second heterocycle, and having on the aromatic ring or second heterocycle an electron-withdrawing group, and/or a cyanine dye (A-2) having at least one fused ring composed of a nitrogen-containing heterocycle in combination with an aromatic ring or a second heterocycle, and having on the aromatic ring or second heterocycle a heavy atom-containing group.

First, the cyanine dye (A-1) having at least one fused ring composed of a nitrogen-containing heterocycle in combination with an aromatic ring or a second heterocycle, and having on the aromatic ring or second heterocycle an electron-withdrawing group is described.

The electron-withdrawing group is a substituent having a Hammett sigma constant at the para position ($\sigma_{para}$ constant) of preferably at least 0.01, more preferably at least 0.05, even more preferably at least 0.20, and further preferably at least 0.30.

Illustrative examples of substituents having a $\sigma_{para}$ constant of at least 0.05 include halogen atoms such as fluorine (0.06), chlorine (0.30), bromine (0.27) and iodine (0.30); carbonyl substituents such as —CHO (0.22), —$COCH_3$ (0.50), —$COC_6H_5$ (0.46), —$CONH_2$ (0.36), —$COO^-$ (0.30), —COOH (0.41), —$COOCH_3$ (0.39) and —$COOC_2H_5$ (0.45); sulfonyl or sulfinyl substituents such as —$SOCH_3$ (0.49), —$SO_2CH_3$ (0.72), —$SO_2C_6H_5$, —$SO_2CF_3$ (0.93), —$SO_2NH_2$ (0.57), —$SO_2OC_6H_5$, —$SO_3^-$ (0.09) and —$SO_3H$ (0.50); nitrogen-containing substituents such as —CN (0.01), —$N(CH_3)_3^+$ (0.82) and —$N(CF_3)_2$ (0.53); and halogen-bearing substituents such as —$CCl_3$, —$CH_2Cl$ (0.18), —$CHCl_2$ and —$CF_3$ (0.54). Values in parentheses here indicate the $\sigma_{para}$ constants for the respective compounds.

Preferred examples of such electron-withdrawing groups include substituents having a non-covalent electron pair. Exemplary substituents having non-covalent electron pairs include carbonyl group-bearing substituents, sulfonyl group-bearing substituents, sulfinyl group-bearing substituents and substituents with an ether bond. Of these, carbonyl group-bearing substituents are preferred.

Specific examples of carbonyl group-bearing substituents include acyl groups such as acetyl and benzoyl; alkoxycarbonyl groups or aryloxycarbonyl groups such as methoxycarbonyl and toluyloxycarbonyl; amide groups such as diethylaminocarbonyl; and carboxy groups. These substituents may be bonded to the aromatic ring or the second heterocycle on the cyanine dye through connecting groups that are at least divalent.

Next, the cyanine dye (A-2) having at least one fused ring composed of a nitrogen-containing heterocycle in combination with an aromatic ring or a second heterocycle, and having on the aromatic ring or second heterocycle a heavy atom-containing group is described.

"Heavy atom-containing group," as used herein, refers to a substituent containing an atom having an atomic weight of at least 28. Preferred examples of such atoms include silicon (28.09), phosphorus (30.97), sulfur (32.07), chlorine (35.45), germanium (72.61), arsenic (74.92), selenium (78.96), bromine (79.90), tin (118.71), antimony (121.76), tellurium (127.60) and iodine (126.90). Values in parentheses here indicate the atomic weights of the respective atoms. Of these heavy atoms, silicon, phosphorus and halogens (e.g., chlorine, bromine, iodine) are preferred from the standpoint of safety and availability of the starting materials. Halogens are especially preferred.

These atoms having an atomic weight of at least 28 form, either alone or in combination with other atoms, the substituents located on the aromatic ring or second heterocycle of the cyanine dye. These substituents may be bonded to the aromatic ring or second heterocycle of the cyanine dye through connecting groups that are at least divalent.

Illustrative examples of silicon-containing substituents include substituents having alkyl or aryl groups on a silicon atom, such as trimethylsilyl, t-butyldimethylsilyl and dimethylphenylsilyl. Illustrative examples of phosphorus-containing substituents include substituents having alkyl or aryl groups on a phosphorus atom, such as dimethylphosphino and diphenylphosphino; and phosphono. Illustrative examples of sulfur-containing substituents include alkylsulfonyl or arylsulfonyl groups such as methylsulfonyl and phenylsulfonyl; alkylsulfinyl or arylsulfinyl groups such as ethylsulfinyl and toluylsulfinyl; sulfur acid groups such as the sulfo, sulfino and sulfeno groups, as well as salts and ester derivatives thereof; and alkylthio and arylthio groups such as methylthio and phenylthio. Illustrative examples of halogen-containing substituents include halogen atoms, halogen-substituted alkyls and halogen-substituted aryls.

To provide the image recording layer with good imaging properties and a suitable absorption wavelength, it is especially preferable for the cyanine dye used in the first aspect of the present invention to be a heptamethine cyanine dye having an indolenine skeleton, a benzoindolenine skeleton, a benzothioazole skeleton, a benzoxazole skeleton or a benzselenazole skeleton. Heptamethine cyanine dyes having an indolenine skeleton or a benzoindolenine skeleton are most preferred. For example, cyanine dyes of formula (1) below are highly desirable.

(1)

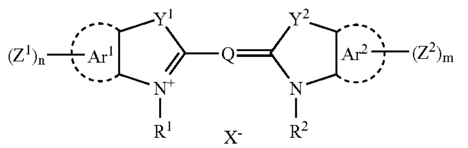

In the formula, $R^1$ and $R^2$ are each independently a hydrocarbon group of up to 20 carbons which may be substituted. Alkyls of 1 to 4 carbons are especially preferred.

$Ar^1$ and $Ar^2$ are each independently an aromatic hydrocarbon group or a heterocyclic group which may have substituents. Illustrative examples of aromatic hydrocarbon groups include benzene rings and naphthalene rings. Illustrative examples of heterocyclic groups include pyridine rings and pyrazine rings. Of these, benzene rings and naphthalene rings are preferred.

$Y^1$ and $Y^2$ are each independently a sulfur atom, oxygen atom, selenium atom, a dialkylmethylene group of up to 12 carbons or a —CH═CH— group. Of these, a dialkylmethylene group (e.g. dimethylmethylene) is preferred.

$Z^1$ and $Z^2$ are each substituents selected from the group consisting of hydrocarbon groups, oxy groups, electron-withdrawing groups and heavy atom-containing groups. Of these, at least one is an electron-withdrawing group or a heavy atom-containing group. Preferred examples of electron-withdrawing groups and heavy atom-containing groups include halogen atoms, carbonyl groups which may have substituents, sulfonyl groups which may have substituents, thio groups, halogenated alkyl groups and silyl groups. Of these, halogen atoms, alkoxycarbonyl groups and halogenated alkyl groups are preferred.

The letters n and m each represent 0 or a higher integer, with the proviso that the sum of n and m is at least 1.

Q is a pentamethine group or a heptamethine group. A heptamethine group is preferable, both in terms of wavelength suitability for infrared light and stability. Q may be substituted with a member selected from the group consisting of alkoxy, aryloxy, alkylthio, arylthio, dialkylamino, diarylamino, halogen atoms, alkyl, aralkyl, cycloalkyl, aryl, oxy, iminium bases and substituents of formula (2) below. Of these, diarylamino groups (e.g., diphenylamino) and arylthio groups (e.g., phenylthio) are preferred. Diarylamino groups are especially preferred. To provide good stability, it is preferable for Q to include a cyclohexene, cyclopentene or cyclobutene ring containing three connected methine chains. Of these, a cyclopentene or cyclohexene ring is preferred.

(2)

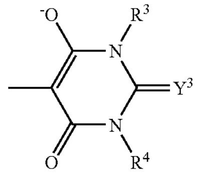

In the formula, $R^3$ and $R^4$ are each independently a hydrogen atom, an alkyl having 1 to 8 carbons, or an aryl having 6 to 10 carbons. $Y^3$ is an oxygen atom or a sulfur atom.

$X^-$ is a counteranion which exists in cases where charge neutralization is required.

A cyanine dye having halogen atoms on aromatic rings at both ends or having carbonyl substituents on aromatic rings at both ends is preferred.

For good shelf stability of the image recording layer-forming coating liquid, preferred examples of the counteranion include halogen ions and the perchlorate, tetrafluoroborate, hexafluorophosphate and sulfonate ions. The perchlorate and sulfonate ions are especially preferred.

Examples of preferred cyanine dyes include those of formula (3) below.

(3)

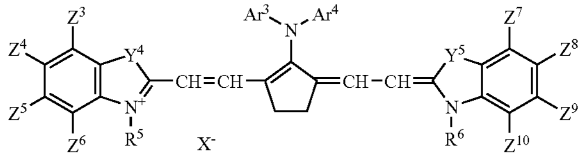

In the formula, $R^5$ and $R^6$ are each independently a hydrocarbon group of up to 20 carbons which may be substituted. Alkyls of 1 to 4 carbons are especially preferred.

$Ar^3$ and $Ar^4$ are each independently a hydrogen, an alkyl having 1 to 4 carbons, or an aryl having 6 to 10 carbons. Phenyl is especially preferred.

$Y^4$ and $Y^5$ are each independently a sulfur atom, oxygen atom, selenium atom, a dialkylmethylene group of up to 12 carbons or a —CH═CH— group. Of these, a dialkylmethylene group (e.g. dimethylmethylene) is preferred.

$Z^3$ to $Z^{10}$ are each hydrogen atoms, electron-withdrawing groups or heavy atom-containing groups. Of these, at least one is an electron-withdrawing group or a heavy atom-containing group. Halogen atoms and alkoxycarbonyl groups are especially preferred.

$X^-$ is the same as in above formula (1). A $CF_3SO_3^-$ ion is preferred.

Specific examples of preferred cyanine dyes include, but are not limited to, those having the chromophore skeletons and substituents shown in the tables below. Of the cyanine dyes appearing in the following tables, IR-2, IR-6, IR-8, IR-11 and IR-33 are compounds represented by above formula (3), where $X^-$ is $CF_3SO_3^-$.

Other preferred cyanine dyes represented by above formula (3) include compounds IR-36 and IR-37, which are employed in the examples appearing later this specification.

Chemical Formulae in Tables 1 to 8

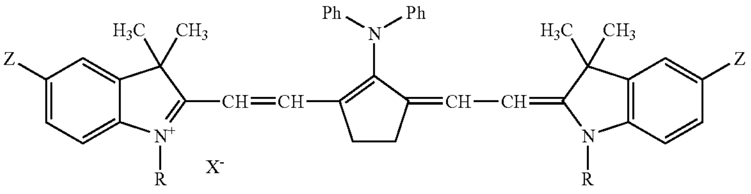

| | Z | R | $X^-$ |
|---|---|---|---|
| IR-1 | Cl | $C_2H_5$ | $ClO_4^-$ |
| IR-2 | Cl | $C_2H_5$ | $CF_3SO_3^-$ |
| IR-3 | Br | $C_3H_7$ | $ClO_4^-$ |
| IR-4 | Br | $C_6H_{13}$ | $PF_6^-$ |
| IR-5 | I | $C_2H_5$ | $ClO_4^-$ |
| IR-6 | I | $C_4H_9$ | $CF_3SO_3^-$ |
| IR-7 | $CO_2C_2H_5$ | $C_2H_5$ | $ClO_4^-$ |
| IR-8 | $SCF_3$ | $CH_3$ | $CF_3SO_3^-$ |
| IR-9 | $SO_2CF_3$ | $CH_3$ | $ClO_4^-$ |
| IR-10 | Cl | $CH_3$ | $BF_4^-$ |
| IR-11 | $CF_3$ | $C_2H_5$ | $CF_3SO_3^-$ |

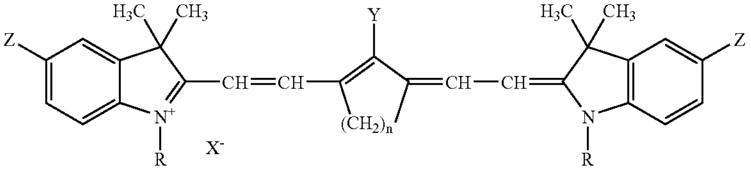

| | Z | R | Y | n | $X^-$ |
|---|---|---|---|---|---|
| IR-12 | Cl | $C_2H_5$ | Cl | 2 | $ClO_4^-$ |
| IR-13 | $CO_2CH_3$ | $CH_3$ | Cl | 2 | $BF_4^-$ |
| IR-14 | Br | $C_2H_5$ | SPh | 3 | $CF_3SO_3^-$ |
| IR-15 | Cl | $C_2H_5$ | OPh | 3 | $ClO_4^-$ |
| IR-16 | I | $CH_3$ | Cl | 3 | $ClO_4^-$ |
| IR-17 | $SO_2CF_3$ | $C_3H_7$ | SPh | 3 | $ClO_4^-$ |
| IR-18 | COPh | $CH_3$ | 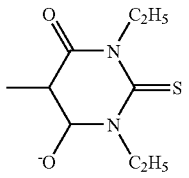 | 3 | — |

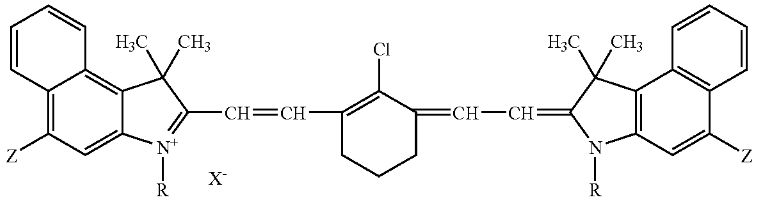
| | Z | R | $X^-$ |
|---|---|---|---|
| IR-19 | $SCF_3$ | $CH_3$ | $ClO_4^-$ |
| IR-20 | $SO_2CF_3$ | $C_2H_5$ | 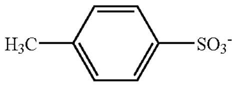 |
| IR-21 | $SCH_3$ | $CH_3$ | $BF_4^-$ |
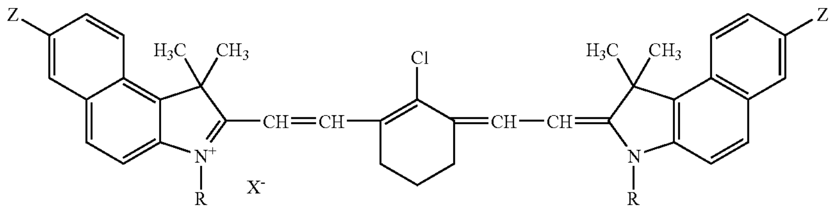
| | Z | R | $X^-$ |
|---|---|---|---|
| IR-22 | $CO_2CH_3$ | $CH_3$ | $ClO_4^-$ |
| IR-23 | $SO_2OC_2H_5$ | $CH_2C_6H_5$ | $CF_3SO_3^-$ |
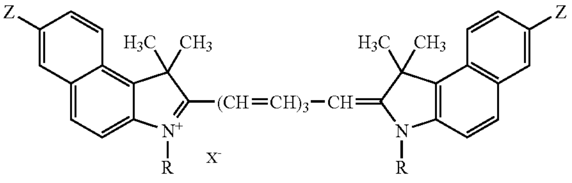
| | Z | R | X |
|---|---|---|---|
| IR-24 | $CO_2CH_3$ | $CH_3$ | $ClO_4^-$ |
| IR-25 | $CO_2Ph$ | $CH_2CH(CH_2)_3CH_3$<br>\|<br>$CH_2CH_3$ | $BF_4^-$ |

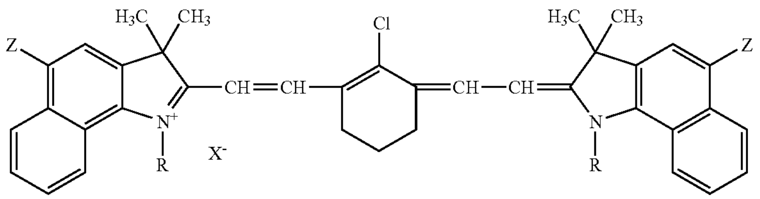

| | Z | R | $X^-$ |
|---|---|---|---|
| IR-26 | Br | $C_2H_5$ | $ClO_4^-$ |
| IR-27 | $SO_2OC_2H_5$ | $CH_3$ | $CF_3SO_3^-$ |

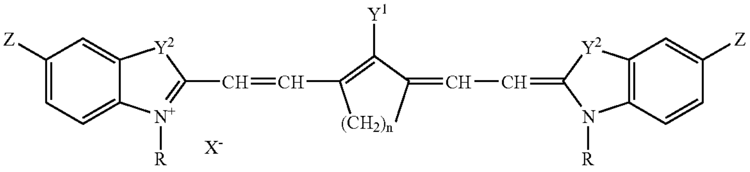

| | Z | R | $Y^1$ | $Y^2$ | $X^-$ |
|---|---|---|---|---|---|
| IR-28 | Cl | $CH_3$ | Cl | S | $ClO_4^-$ |
| IR-29 | Br | $CH_2(CH_2)_8CH_3$ | SPh | S | $Br^-$ |
| IR-30 | $COCH_3$ | $CH_2CH{=}CH_2$ | Cl | O | $SbF_6^-$ |
| IR-31 | $CO_2C_2H_5$ | $CH_3$ | $NPh_2$ | S | $BF_4^-$ |

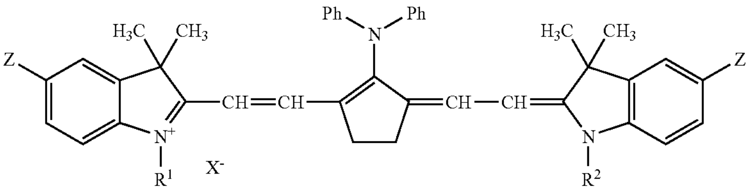

| | $Z^1$ | $Z^2$ | $R^1$ | $R^2$ | $X^-$ |
|---|---|---|---|---|---|
| IR-32 | Cl | H | $C_2H_5$ | $C_2H_5$ | $ClO_4^-$ |
| IR-33 | Cl | $CH_3$ | $C_2H_5$ | $CH_3$ | $CF_3SO_3^-$ |
| IR-34 | Cl | $C(CH_3)_3$ | $CH_3$ | $CH_3$ | $ClO_4^-$ |
| IR-35 | I | Cl | $C_2H_5$ | $C_2H_5$ | $ClO_4^-$ |

The above cyanine dyes may be used singly or as combinations of two or more thereof.

The use in the present invention of an infrared absorber (A) which is a cyanine dye having at least one fused ring composed of a nitrogen-containing heterocycle in combination with an aromatic ring or a second heterocycle, and having on the aromatic ring or second heterocycle an electron-withdrawing group or a heavy atom-containing group provides the presensitized plate with an excellent sensitivity and provides the lithographic printing plate obtained by on-machine development with an excellent press life. Accordingly, by exposing the presensitized plate using an infrared-emitting laser at a practical amount of energy and subjecting the exposed plate to on-machine development, a large number of good impressions can be obtained without carrying out a development step.

Concomitant use can also be made of infrared absorbers other than the above cyanine dyes A-1 and A-2, insofar as the objects of the present invention are attainable. In such cases, the content of infrared absorbers other than above cyanine dyes A-1 and A-2 is preferably not more than 40 wt %, based on the total infrared absorber solids.

Infrared absorbers which can be concomitantly used are not subject to any particular limitations in their absorption wavelength range, provided they are substances which absorb the light energy radiation used in recording and generate heat. However, for good compatibility with readily available high-output lasers, infrared-absorbing dyes and pigments having absorption maxima in a wavelength range of 760 to 1200 nm are preferred.

Dyes which may be used include commercial dyes and known dyes that are mentioned in the technical literature, such as *Senryo Binran* [Handbook of Dyes] (The Society of Synthetic Organic Chemistry, Japan, 1970). Suitable dyes include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, metal-thiolate complexes, oxonol dyes, diimonium dyes, aminium dyes and croconium dyes.

Preferred dyes include the cyanine dyes mentioned in JP 58-125246 A, JP 59-84356 A, JP 59-202829 A and JP 60-78787 A; the methine dyes mentioned in JP 58-173696 A, JP 58-181690 A and JP 58-194595 A; the naphthoquinone dyes mentioned in JP 58-112793 A, JP 58-224793 A, JP 59-48187 A, JP 59-73996 A, JP 60-52940 A and JP 60-63744 A; the squarylium dyes mentioned in JP 58-112792 A; and the cyanine dyes mentioned in GB 434,875 B.

The near-infrared absorbing sensitizers mentioned in U.S. Pat. No. 5,156,938 can also be advantageously used. Other compounds that are preferable for use in this way include the substituted arylbenzo(thio)pyrylium salts mentioned in U.S. Pat. No. 3,881,924; the trimethinethiapyrylium salts mentioned in JP 57-142645 A (U.S. Pat. No. 4,327,169), the pyrylium compounds mentioned in JP 58-181051 A, JP 58-220143 A, JP 59-41363 A, JP 59-84248 A, JP 59-84249 A, JP 59-146063 A and JP 59-146061 A; the cyanine dyes mentioned in JP 59-216146 A; the pentamethinethiopyrylium salts mentioned in U.S. Pat. No. 4,283,475; and the pyrylium compounds mentioned in JP 5-13514 B (the term "JP XX-XXXXXX B" as used herein means an "examined Japanese patent publication") and JP 5-19702 B.

The near-infrared absorbing dyes of formulas (I) and (II) in U.S. Pat. No. 4,756,993 are also preferred.

Especially preferred examples of these dyes include cyanine dyes, phthalocyanine dyes, oxonol dyes, squarylium dyes, pyrylium salts, thiopyrylium dyes and nickel-thiolate complexes. The dyes of general formulas (a) to (e) below are even more preferable on account of their excellent photothermal conversion efficiency. The cyanine dyes of general formula (a) below are especially preferable because they provide a high polymerization activity and also have an excellent stability and cost effectiveness.

GENERAL FORMULA (a)

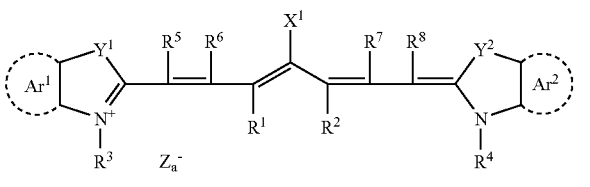

In general formula (a) above, $X^1$ is a hydrogen atom, a halogen atom, —$NPh_2$ (where "Ph" represents a phenyl group), an oxygen atom, a sulfur atom, a hydrocarbon group of 1 to 12 carbons, a heteroatom-containing aromatic ring, a heteroatom-containing hydrocarbon group of 1 to 12 carbons, or a group of the following formula. "Heteroatom," as used herein, signifies an atom of nitrogen, sulfur or oxygen, a halogen atom, or a selenium atom.

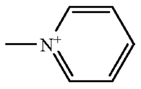

$R^1$ and $R^2$ are each a hydrocarbon group of 1 to 12 carbons, and may be bonded to each other. For good shelf stability of the image recording layer-forming coating liquid, it is preferable for $R^1$ and $R^2$ each to be a hydrocarbon group having at least two carbons. It is even more preferable for $R^1$ and $R^2$ to be bonded to each other so as to form a 5- or 6-membered ring.

$Ar^1$ and $Ar^2$ are each independently an aromatic hydrocarbon group that may be substituted. Preferred aromatic hydrocarbon groups include benzene rings and naphthalene rings. Preferred substituents include hydrocarbon groups of up to 12 carbons, halogen atoms, and alkoxy groups of up to 12 carbons.

$Y^1$ and $Y^2$ are each independently a sulfur atom or a dialkylmethylene group of up to 12 carbons.

$R^3$ and $R^4$ are each independently a hydrocarbon group of up to 20 carbons which may be substituted. Preferred substituents include alkoxy groups of up to 12 carbons, carboxy groups and sulfo groups.

$R^5$ to $R^8$ are each independently a hydrogen atom or a hydrocarbon group of up to 12 carbons. For reasons having to do with the availability of the starting materials, it is preferable for each of $R^5$ to $R^8$ to be a hydrogen atom.

$Z_a^-$ represents a counteranion. However, in cases where any one of $R^1$ to $R^8$ is substituted with a sulfo group, $Z_a^-$ is unnecessary. For good shelf stability of the image recording layer-forming coating liquid, preferred examples of $Z_a^-$ include halide ions, perchlorate ions, tetrafluoroborate ions, hexafluorophosphate ions and sulfonate ions. Of these, perchlorate ions, hexafluorophosphate ions and arylsulfonate ions are preferred.

Specific examples of the cyanine dyes of formula (a) above are shown below.

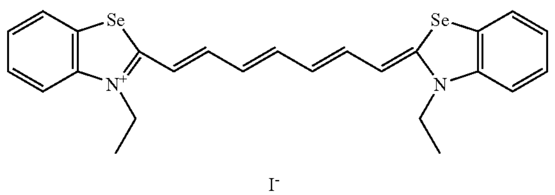

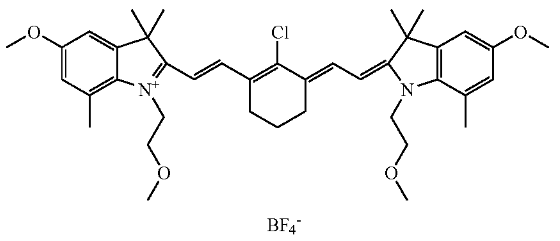

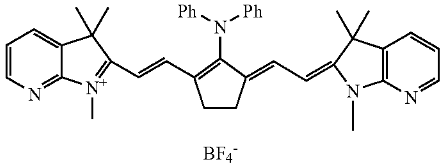

-continued

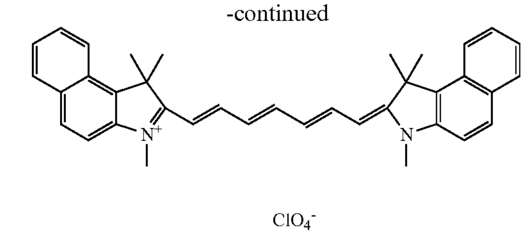

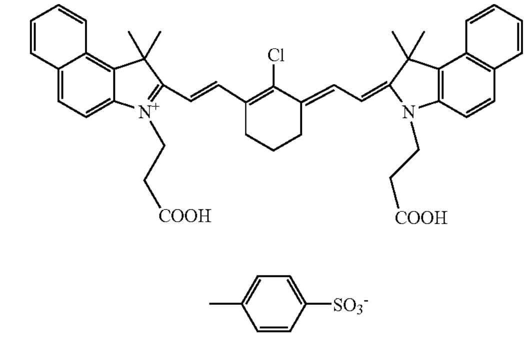

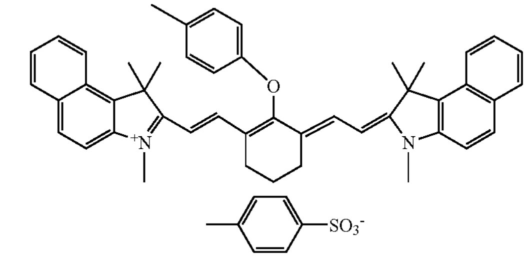

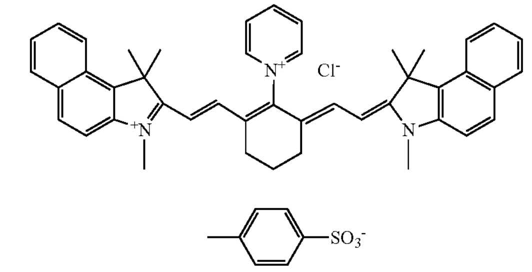

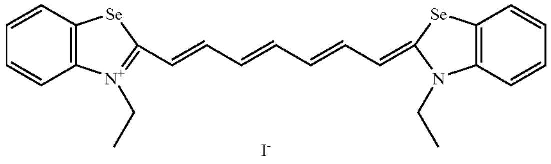

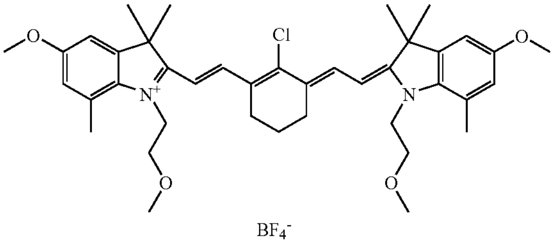

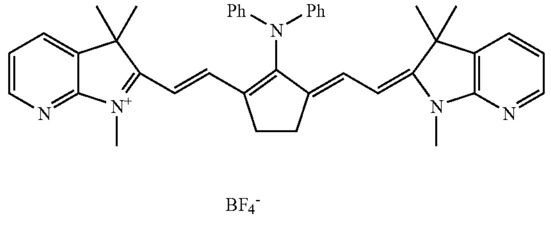

-continued

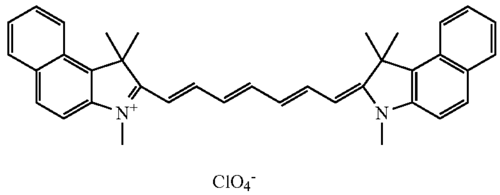

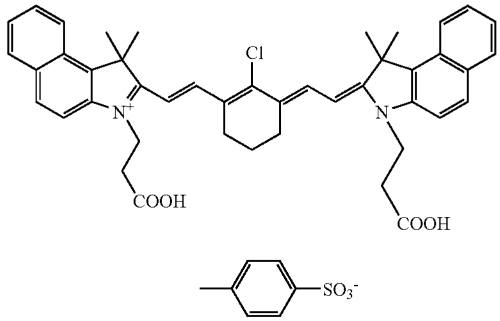

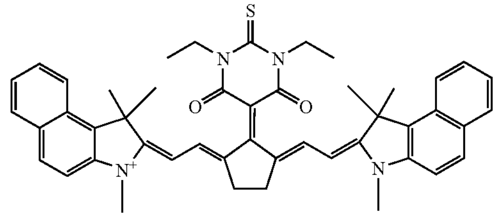

GENERAL FORMULA (b)

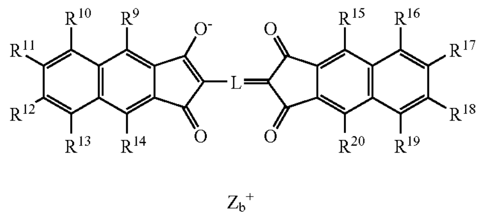

In general formula (b) above, L is a methine chain of at least 7 covalent carbons. The methine chain may have substituents, which may be mutually bonded to form a ring structure.

$Z_b^+$ is a countercation. Preferred examples include ammonium, iodonium, sulfonium, phosphonium, pyridinium and alkali metal cations ($Na^+$, $K^+$, $Li^+$).

$R^9$ to $R^{20}$ each represent a substituent selected from the group consisting of hydrogen, halogen atoms, cyano, alkyl, aryl, alkenyl, alkynyl, carbonyl, thio, sulfonyl, sulfinyl, oxy and amino, or a substituent which is a combination of any two or three thereof. $R^9$ to $R^{20}$ may bond with each other to form ring structures.

For reasons having to do with ready availability and effectiveness, it is preferable for dyes of above general formula (b) to be ones in which L is a methine chain having 7 covalent carbons and $R^9$ to $R^{20}$ are all hydrogen atoms.

Specific examples of dyes of general formula (b) above are shown below.

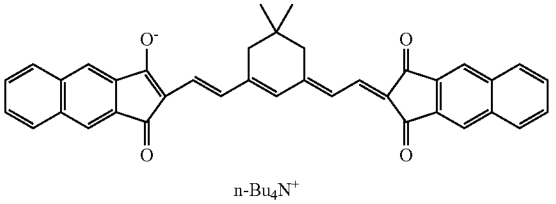

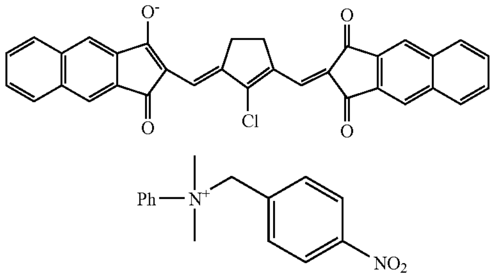

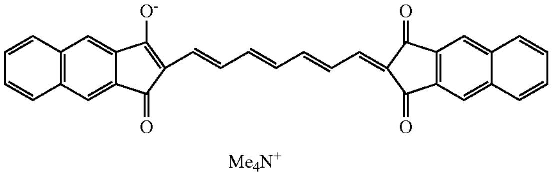

GENERAL FORMULA (c)

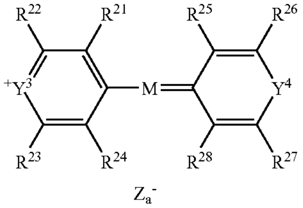

In general formula (c) above, $Y^3$ and $Y^4$ are each independently an oxygen atom, a sulfur atom, a selenium atom or a tellurium atom.

M is a methine chain having at least 5 covalent carbons.

$R^{21}$ to $R^{28}$ are each independently hydrogen atom, halogen atom, cyano, alkyl, aryl, alkenyl, alkynyl, carbonyl, thio, sulfonyl, sulfinyl, oxy or amino.

$Z_a^-$ is the same here as in general formula (a) above.

Specific examples of the dyes of general formula (c) above are shown below.

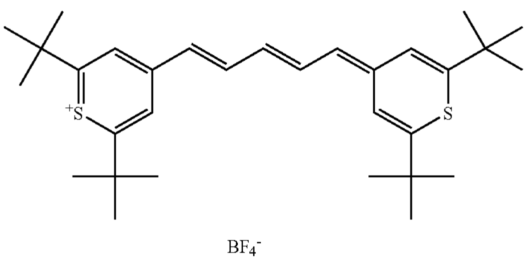

-continued

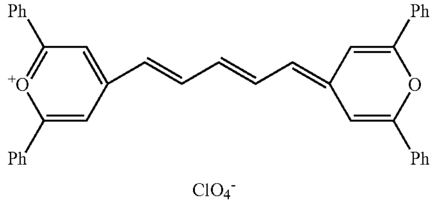

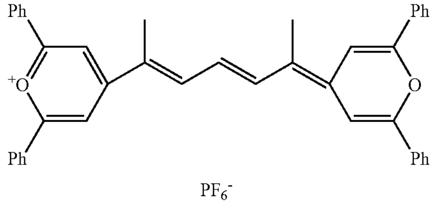

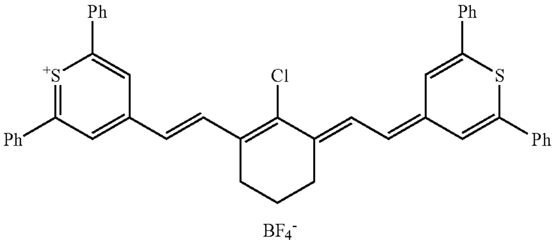

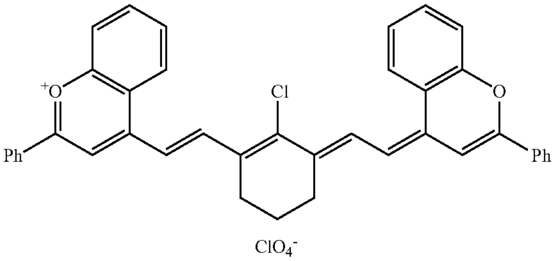

GENERAL FORMULA (d)

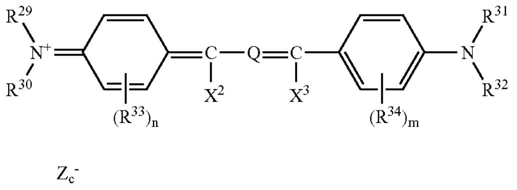

In general formula (d), $R^{29}$ to $R^{32}$ are each independently a hydrogen atom, an alkyl group or an aryl group. $R^{29}$ and $R^{30}$ may bond with each other to form a ring. Likewise, $R^{31}$ and $R^{32}$ may bond with each other to form a ring.

$R^{33}$ and $R^{34}$ are each independently an alkyl group, a substituted oxy group or a halogen atom. In cases where there exists a plurality of $R^{33}$ and a plurality of $R^{34}$, the $R^{33}$ moieties may be mutually bonded or the $R^{34}$ moieties may be mutually bonded to form a ring.

It is also possible for $R^{29}$ and/or $R^{30}$ to bond with $R^{33}$ to form a ring, and for $R^{31}$ and/or $R^{32}$ to bond with $R^{34}$ to form a ring.

The letters n and m are each independently integers from 0 to 4.

$X^2$ and $X^3$ are each independently a hydrogen atom, an alkyl group or an aryl group, provided at least one of $X^2$ and $X^3$ is a hydrogen atom or an alkyl group.

Q is a trimethine or pentamethine group which may be substituted, and which may form a ring structure together with a divalent organic group.

$Z_c^-$ is the same as $Z_a^-$ in general formula (a) above.

Specific examples of the dyes of general formula (d) above are shown below.

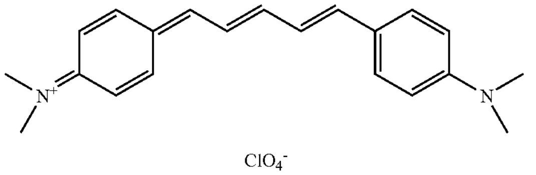

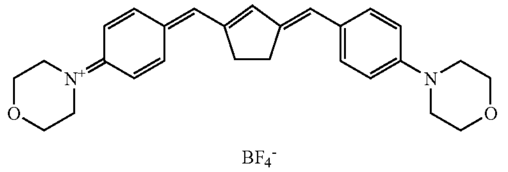

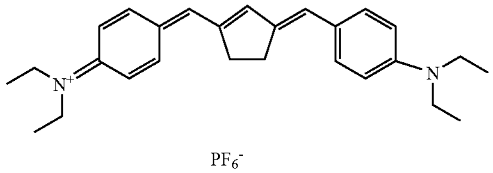

GENERAL FORMULA (e)

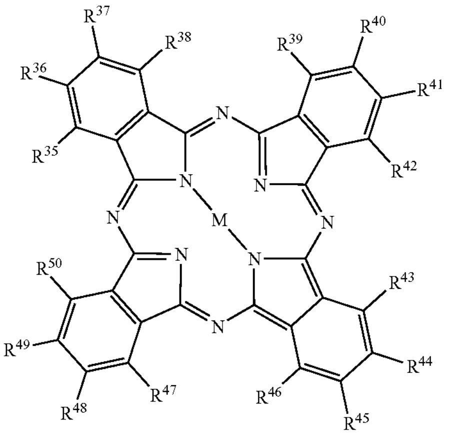

In general formula (e) above, $R^{35}$ to $R^{50}$ are each independently hydrogen atom, halogen atom or a substituted or unsubstituted cyano, alkyl, aryl, alkenyl, alkynyl, hydroxy, carbonyl, thio, sulfonyl, sulfinyl, oxy or amino group or onium salt structure. If $R^{35}$ to $R^{50}$ have a charge, the dye of general formula (e) may also have a counterion.

M represents two hydrogen atoms, a metal atom, a halometal group or an oxymetal group. Some metal atoms that may be included in M are elements belonging to group 1 (group IA), group 2 (group IIA), group 13 (group IIIB) and group 14 (group IVB) of the Periodic Table, transition metal elements and lanthanoid elements. Of these, copper, magnesium, iron, zinc, cobalt, aluminum, titanium and vanadium are preferred.

Specific examples of the dyes of general formula (e) above are shown below.

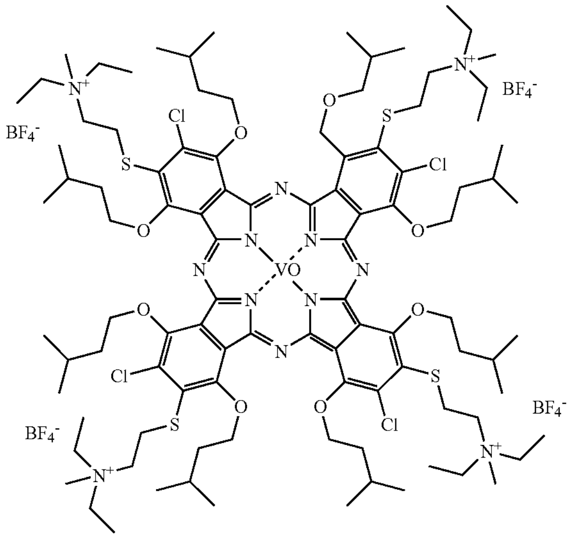

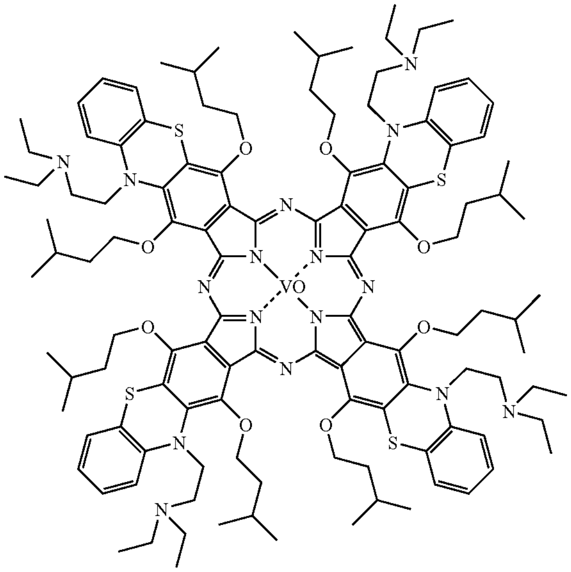

Pigments which may be used include commercial pigments and pigments mentioned in the technical literature, such as the *Colour Index, Saishin Ganryo Binran* [Latest Handbook of Pigments] (Japan Association of Pigment Technology, 1977), *Saishin Ganryo Oyo Gijutsu* [Recent Pigment Applications Technology] (CMC Shuppan, 1986), and *Insatsu Inki Gijutsu* [Printing Ink Technology] (CMC Shuppan, 1984).

Suitable pigments include black pigments, yellow pigments, orange pigments, brown pigments, red pigments, purple pigments, blue pigments, green pigments, fluorescent pigments, metal powder pigments and polymer-bonded dyes. Specific examples include insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, lake pigments, azine pigments, nitroso pigments, nitro pigments, natural pigments, fluorescent pigments, inorganic pigments and carbon black. Of these, carbon black is preferred.

The pigments may be used without being surface treated or may be used after surface treatment. Examples of surface treatment methods include surface coating with a resin or wax, surfactant deposition, and bonding a reactive substance (e.g., a silane coupling agent, an epoxy compound or a polyisocyanate) to the pigment surface. Surface treatment methods that may be used include those described in *Kinzoku Sekken no Seishitsu to Oyo* [Properties and Applications of Metallic Soaps] (Koshobo), *Insatsu Inki Gijutsu* [Printing Ink Technology] (CMC Shuppan, 1984), and *Saishin Ganryo Oyo Gijutsu* [Recent Pigment Applications Technology] (CMC Shuppan, 1986).

Infrared absorbers that may be used in the second aspect of the present invention have an oxidation potential of at most 0.45 V (vs. SCE). The oxidation potential of the infrared absorber is preferably at most 0.40 V (vs. SCE), and even more preferably at most 0.35 V (vs. SCE).

There is no specific lower limit to the oxidation potential of infrared absorbers that may be preferably used, although for the sake of stability when used in combination with the radical generator (B), it is desirable for the infrared absorber to have an oxidation potential which is preferably at least 0.10 V (vs. SCE), and more preferably at least 0.15 V (vs. SCE).

For such an infrared absorber to have a small oxidation potential, it is preferable that the chromophore on the infrared absorber have an electron-donating substituent. Preferred electron-donating substituents include substituents having a Hammett sigma constant at the para position ($\sigma_{para}$ constant) of −0.10 or less. Specific examples include alkyl groups such as methyl, ethyl and propyl (with $\sigma_{para}$ constants of about −0.12 to about −0.20); hydroxy groups ($\sigma_{para}$ constant, −0.37); alkoxy groups such as methoxy, ethoxy, propyloxy and butoxy (with $\sigma_{para}$ constants of about −0.24 to about −0.45); aryloxy groups such as phenoxy and toluyloxy ($\sigma_{para}$ constant, about −0.32); and amino or substituted amino groups such as amino, methylamino, ethylamino, butylamino, dimethylamino, diethylamino, phenylamino and diphenylamino (with $\sigma_{para}$ constants of −0.50 to about −0.35). Of these, groups having large electron donating properties, such as alkoxy groups and amino or substituted amino groups, are especially preferred.

Substituents having an aromatic group linked to a heteroatom are also preferred because they expand the conjugated system of the chromophore and lower the oxidation potential. Illustrative examples of aromatic group-linking heteroatoms include nitrogen, oxygen, phosphorus, sulfur and selenium atoms. Sulfur atoms are especially preferred as the heteroatoms.

Illustrative examples of the aromatic group linked to the above heteroatom include hydrocarbon aromatic groups such as phenyl, naphthyl and anthranyl; and heterocyclic groups such as furyl, thienyl, pyrazolyl, triazolyl, indolyl and benzothiazolyl. A heterocyclic group is especially preferred. These aromatic groups may have substituents, preferred examples of which include the above substituents having a Hammett $\sigma_{para}$ constant of −0.10 or less.

For a suitable absorption wavelength, good solubility, good stability and a suitable oxidation potential, desirable examples of the chromophore on the infrared absorber include polymethine dyes such as cyanine dyes and (thio) pyrylium dyes. Of these, cyanine dyes are preferred. To provide a suitable absorption wavelength and a suitable oxidation potential, it is especially preferable for the cyanine dye used in the present invention to be a heptamethine cyanine dye having an indolenine skeleton, a benzoindolenine skeleton, a benzothioazole skeleton, a benzoxazole skeleton or a benzselenazole skeleton. These polymethine dyes are generally cationic dyes in which the chromophore has a positive charge. However, to make the oxidation potential small, a betaine-type dye having a negative charge within the chromophore is preferred. Illustrative examples of betaine-type dyes include dyes in which the polymethine chain is substituted with a (thio)barbituric acid group, and dyes in which a squarylium skeleton or a croconium skeleton has been incorporated into the polymethine chain.

Of the various dyes containing the above chromophores, those dyes of general formulas D1 to D5 below are preferred.

(D 1)

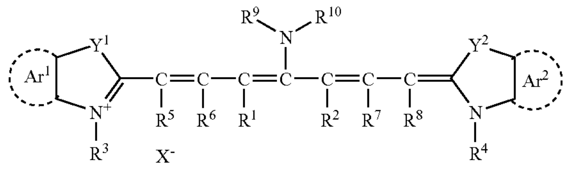

In the formula D1, $R^1$ and $R^2$ are each independently a hydrogen atom or a hydrocarbon group having 1 to 12 carbon atoms. $R^1$ and $R^2$ may be mutually bonded to form a cyclic structure, in which case the ring that forms is preferably a 5-membered or 6-membered ring. $Ar^1$ and $Ar^2$, which may be like or unlike, are each an aromatic hydrocarbon group which may have a substituent. Preferred aromatic hydrocarbon groups include benzene rings and naphthalene rings. Preferred substituents include hydrocarbon groups of up to 12 carbon atoms, halogen atoms, and alkoxy groups of up to 12 carbon atoms. $Y^1$ and $Y^2$, which may be like or unlike, each represent a sulfur atom or a dialkylmethylene group of up to 12 carbon atoms. $R^3$ and $R^4$, which may be like or unlike, are hydrocarbon groups of up to 20 carbon atoms, which groups may have substituents. Preferred substituents include alkoxy groups of up to 12 carbon atoms, carboxy groups and sulfo groups. $R^5$, $R^6$, $R^7$ and $R^8$, which may be like or unlike, are hydrogen atoms or hydrocarbon groups of up to 12 carbon atoms. For reasons having to do with the availability of feedstock, hydrogen atoms are preferred. $R^9$ and $R^{10}$, which may be like or unlike, are aromatic hydrocarbon groups of 6 to 10 carbon atoms which may be substituted, alkyl groups of 1 to 8 carbon atoms or a hydrogen atom. Alternatively, $R^9$ and $R^{10}$ may mutually bond to form rings of the following structures.

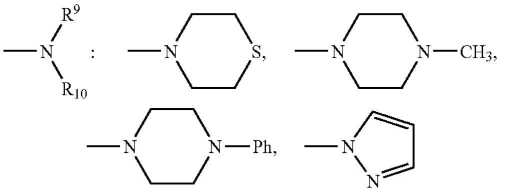

Of these, aromatic hydrocarbon groups such as phenyl are preferred.

$X^-$ is a counteranion. In cases where any one of $R^1$ to $R^8$ is substituted with a sulfo group, $X^-$ is unnecessary. For good shelf stability of the image recording layer-forming coating liquid, preferred examples of $X^-$ include halogen ions and the perchlorate, tetrafluoroborate, hexafluorophosphate and sulfonate ions. Perchlorate, hexafluorophosphate and arylsulfonate ions are especially preferred.

(D 2)

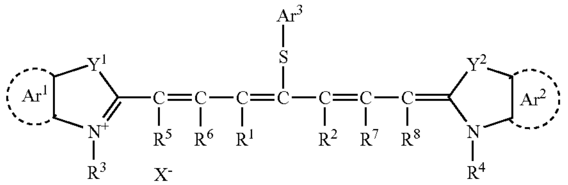

In formula D2, $R^1$ to $R^8$, $Ar^1$, $Ar^2$, $Y^1$, $Y^2$ and $X^-$ are each the same as in general formula D1. $Ar^3$ is a heterocyclic group that is monocyclic or polycyclic and contains at least one of nitrogen, oxygen and sulfur atom. A heterocyclic group selected from the among thiazole, benzothiazole, naphthothiazole, thianaphtheno-7',6',4,5-thiazole, oxazole, benzoxazole, naphthoxazole, selenazole, benzoselenazole, naphthoselenazole, thiazoline, 2-quinoline, 4-quinoline, 1-isoquinoline, 3-isoquinoline, benzoimidazole, 3,3-dialkylbenzoindolenine, 2-pyridine, 4-pyridine, 3,3-dialkylbenzo[e]indole, tetrazole, triazole, pyrimidine and thiadiazole is preferred. Heterocyclic groups having the following structure are especially preferred.

$Ar^3$:

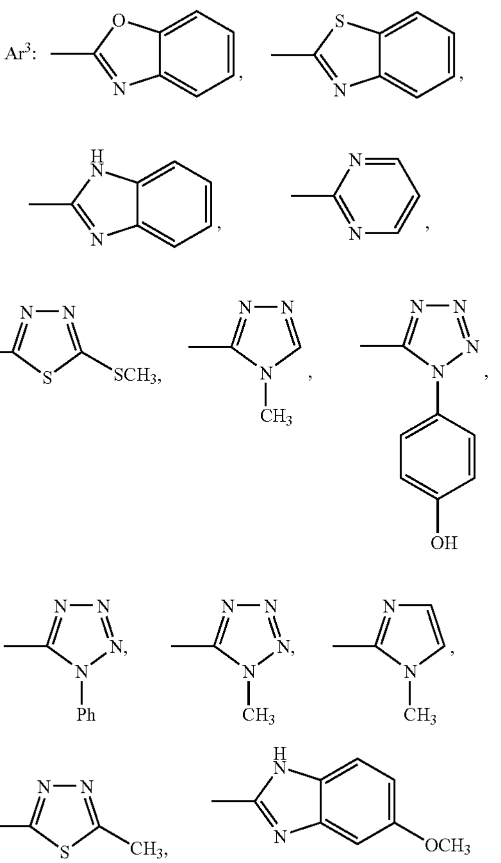

-continued (D3)

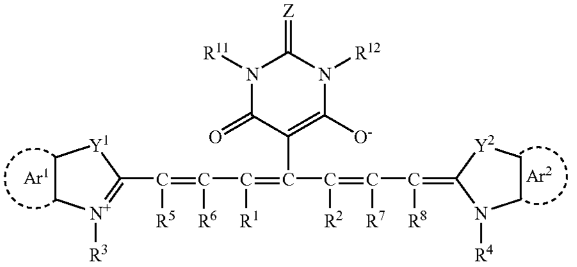

In formula D3, $R^1$ to $R^8$, $Ar^1$, $Ar^2$, $Y^1$ and $Y^2$ are each the same as in general formula D1. $R^{11}$ and $R^{12}$, which may be like or unlike, represent a hydrogen atom, an allyl group, a cyclohexyl group or an alkyl of 1 to 8 carbons. Z is an oxygen atom or a sulfur atom.

(D 4)

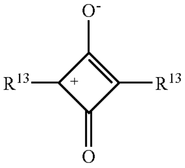

In formula D4, the groups represented by $R^{13}$ are each independently a substituent of one of the following structures, wherein $R^{14}$ and $R^{15}$ are each independently an alkyl of 1 to 8 carbons and $Y^3$ is an oxygen or sulfur atom.

$R^{13}$:

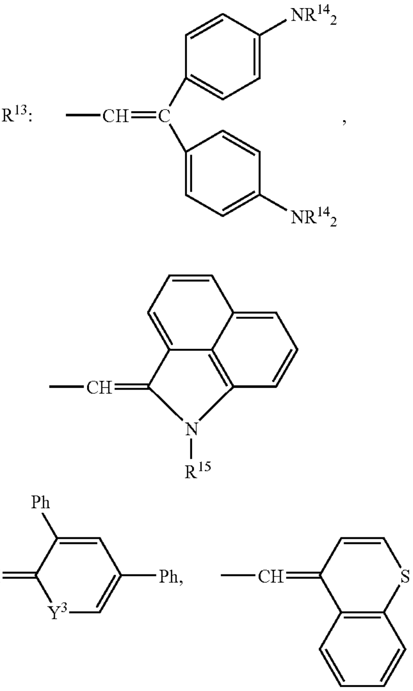

-continued (D 5)

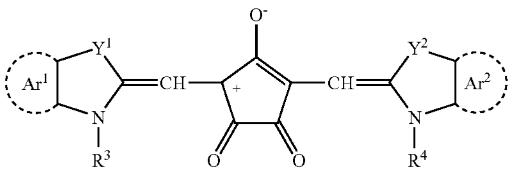

In formula D5, $R^3$, $R^4$, $Ar^1$, $Ar^2$, $Y^1$ and $Y^2$ are each the same as in above general formula D1.

Of the dyes having the above chromophores, dyes represented by general formula D1 to D3 are preferred. Dyer of general formula D1 are especially preferred.

The "oxidation potential" of the infrared absorber in the second aspect of the present invention refers herein to the value measured by potentiometry in a polar solvent such as acetonitrile or methanol using a suitable indicator electrode (e.g., a hydrogen electrode, glass electrode or quinhydrone electrode) and a suitable reference electrode (e.g., a saturated calomel electrode or a silver-silver chloride electrode), and expressed as a potential with respect to a standard calomel electrode (a saturated calomel electrode, abbreviated herein as "SCE").

Specific, non-limiting examples of some infrared absorbers having an oxidation potential of up to 0.45 V (vs. SCE) that are preferred for use in the second aspect of the present invention (IR-1 to IR-12) are shown below together with their oxidation potentials. The oxidation potentials for the following infrared absorbers were obtained by measuring the potential in a polar solvent (0.1 M $Et_4NClO_4$/MeCN, where "Et" stands for ethyl and "Me" stands for methyl) and using a platinum rotating disk electrode as the indicator electrode and a Ag/AgCl (silver-silver chloride) electrode as the reference electrode, then expressing the measured potential as a value with respect to a standard calomel electrode as the reference electrode.

| INFRARED ABSORBENT | STRUCTURE | OXIDATION POTENTIAL (V vs. SCE) |
|---|---|---|
| IR-1 | 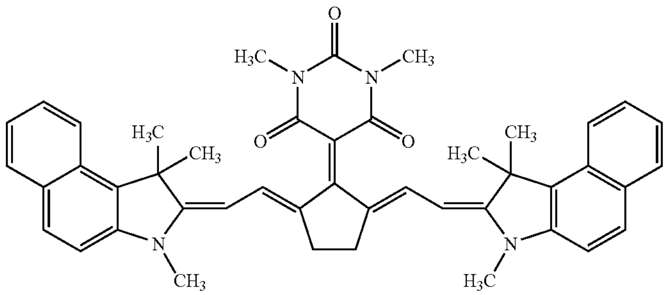 | 0.20 |
| IR-2 | 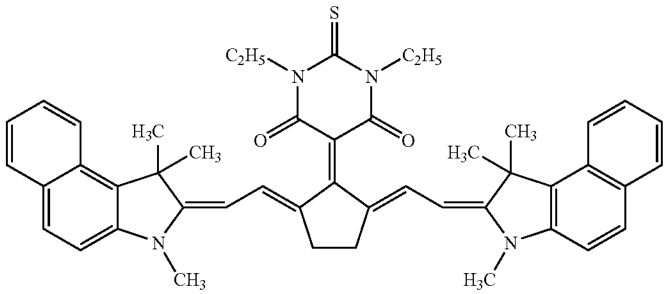 | 0.22 |
| IR-3 | 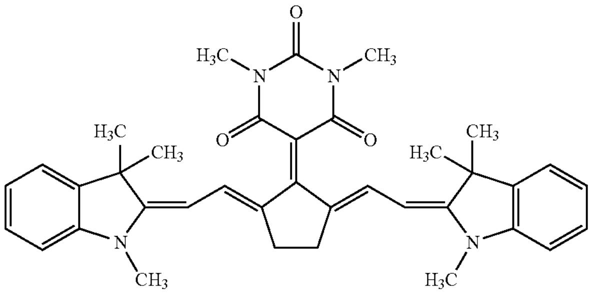 | 0.24 |

-continued
| INFRARED ABSORBENT | STRUCTURE | OXIDATION POTENTIAL (V vs. SCE) |
|---|---|---|
| IR-4 | 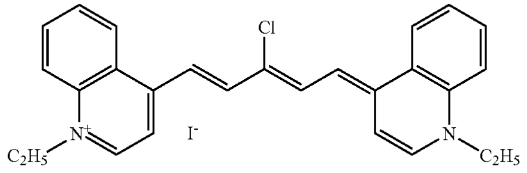 | 0.27 |
| IR-5 | 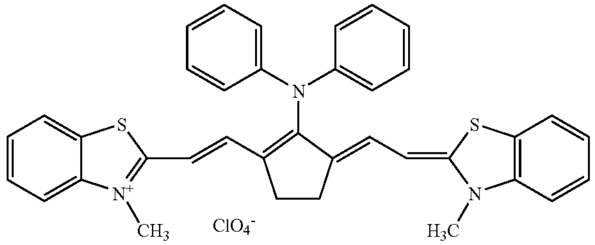 | 0.27 |
| IR-6 | 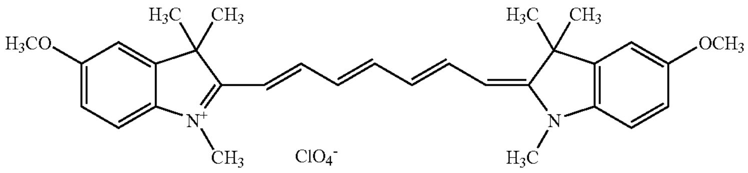 | 0.30 |
| IR-7 | 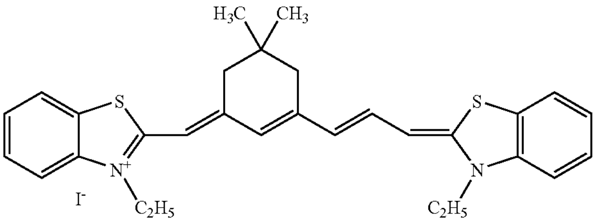 | 0.30 |
| IR-8 | 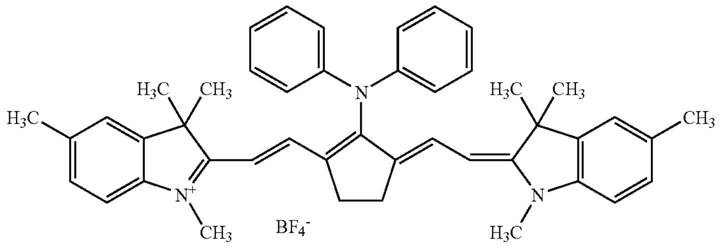 | 0.35 |
| IR-9 | 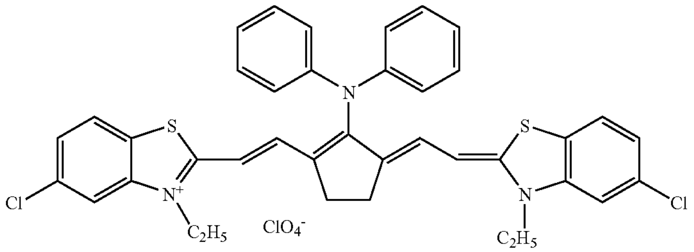 | 0.35 |

-continued

| INFRARED ABSORBENT | STRUCTURE | OXIDATION POTENTIAL (V vs. SCE) |
| --- | --- | --- |
| IR-10 | 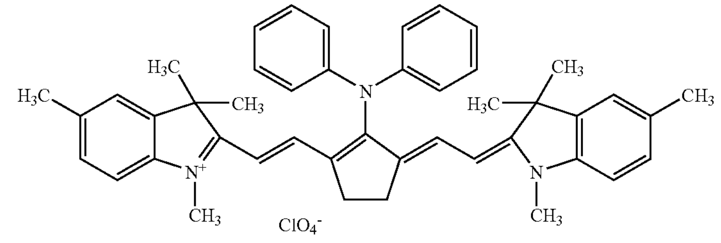 | 0.35 |
| IR-11 | 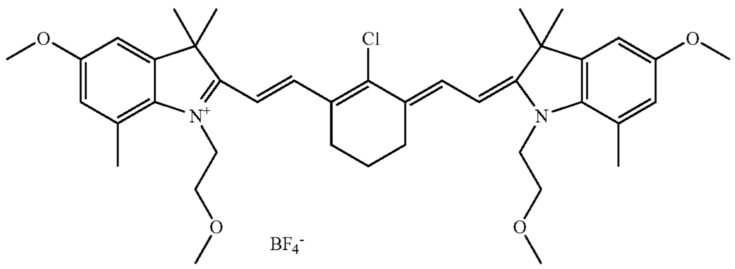 | 0.40 |
| IR-12 | 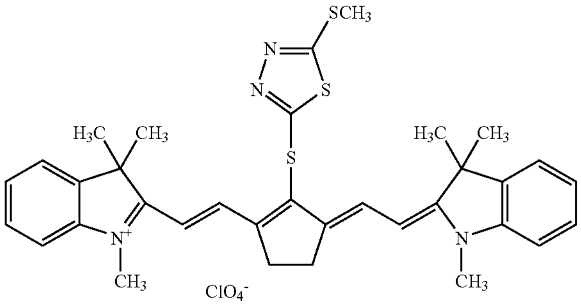 | 0.44 |

When an infrared absorber having a low oxidation potential like those shown above is used, the curability of the image recording layer is dramatically improved compared with cases in which an infrared absorber having a high oxidation potential is used. The reason for this is not entirely clear, although it is presumed that the use of an infrared absorber having a low oxidation potential together with an ionic radical generator promotes decomposition of the radical generator, enabling the polymerization reaction to proceed rapidly and resulting in the formation of image areas of excellent strength.

Ordinary infrared absorbers having an oxidation potential greater than 0.45 V (vs. SCE) may be used concomitantly, insofar as the desired effects of the present invention are not compromised. However, in such cases, it is preferable for such concomitant ordinary infrared absorbers to represent no more than 40 wt % of the total infrared absorber solids. The infrared absorbers that may be used concomitantly include dyes and pigments mentioned in JP 7-285275 A and JP 10-268512 A.

In the first and second.aspects of the present invention, a single infrared absorber may be used alone, or two or more infrared absorbers may be used together.

The content of the above-described infrared absorber (A) and other infrared absorbers is preferably from 0.01 to 50 wt %, more preferably from 0.1 to 20 wt %, and further preferably from 0.5 to 10 wt %, still further preferably from 1 to 10 wt %, based on the total solids in the image recording layer. The sensitivity and the film strength of the image areas are particularly good within this range.

It is preferable for the image recording layer to have an optical density at the absorption maximum in the infrared region of from 0.05 to 3.0. Within this range, the layer has a high sensitivity. Because the foregoing optical density is determined by the content of the infrared absorber and the thickness of the image recording layer, the desired optical density can be obtained by controlling these two parameters.

The optical density of the image recording layer can be measured by an ordinary method. In one suitable method, a transparent or white support has formed thereon an image recording layer of a thickness selected so that the coated amount after drying is within the required range for the presensitized plate, following which the optical density of the dried layer is measured with a transmission-type optical densitometer. In another method, the image recording layer is formed on a reflective support such as aluminum, and the reflection density is measured.

In the image recording layer, the infrared absorber may be added to the same layer as the. other components, or it may be added to a different, separately provided layer such as the subsequently described overcoat layer.

Radical Generator (B):

The radical generator generates radicals under the effect of light, heat or both forms of energy, thereby initiating and accelerating polymerization of the subsequently described radical polymerizable compound (C).

The radical generator (B) used in the present invention may be, for example, a known thermal polymerization initiator or a compound having bonds with a small bond dissociation energy. Exemplary radical generators include onium salts, trihalomethyl group-contatining triazine compounds, peroxides, azo-type polymerization initiators, azide compounds, quinonediazide compounds, metallocene compounds and organoborate compounds. Of these, onium salts are especially preferred on account of their high sensitivity.

Specific examples of onium salts include diazonium salts, iodonium salts, sulfonium salts, ammonium salts and pyridinium salts. Of these, iodonium salts, diazonium salts and sulfonium salts are preferred, sulfonium salts are more preferred, and sulfonium salts having a counterion that is a carboxylate ion are even more preferred. Preferred examples include the onium salts described in JP 2001-133969 A and the onium salts of general formulas (III) to (V) below. In the practice of the present invention, water-soluble onium salts are desirable because they increase the hydrophilic properties of the image recording layer and thus increase its on-machine developability.

GENERAL FORMULA (V)

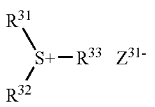

In general formula (III), $Ar^{11}$ and $Ar^{12}$ are each independently an aryl group of up to 20 carbons which may have substituents. Preferred substituents include halogen atoms, nitro, alkyl groups of up to 12 carbons, alkoxy groups of up to 12 carbons, and aryloxy groups of up to 12 carbons.

$Z^{11-}$ is a counterion selected from the group consisting of halide ions, perchlorate ions, tetrafluoroborate ions, hexafluorophosphate ions, carboxylate ions and sulfonate ions. Of these, perchlorate ions, hexafluorophosphate ions, carboxylate ions and arylsulfonate ions are preferred.

In general formula (IV) above, $Ar^{21}$ is an aryl group of up to 20 carbons which may have substituents. Preferred substituents include halogen atoms, nitro, alkyl groups of up to 12 carbons, alkoxy groups of up to 12 carbons, aryloxy groups of up to 12 carbons, alkylamino groups of up to 12 carbons, dialkylamino groups of up to 12 carbons, arylamino groups of up to 12 carbons and diarylamino groups of up to 12 carbons.

$Z^{21-}$ the same as $Z^{11-}$ in general formula (III) above.

In general formula (V) above, $R^{31}$ to $R^{33}$ are each independently a hydrocarbon group of up to 20 carbons which may have substituents. Preferred substituents include halogen atoms, nitro, alkyl groups of up to 12 carbons, alkoxy groups of up to 12 carbons, and aryloxy groups of up to 12 carbons.

$Z^{31-}$ is the same as $Z^{11-}$ in general formula (III) above.

Specific examples are given below of the onium salts of above general formula (III) (OI-1 to OI-10), the onium salts of above general formula (IV) (ON-1 to ON-5) and the onium salts of above general formula (V) (OS-1 to OS-7).

[OI-1]

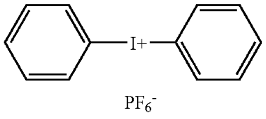

[OI-2]

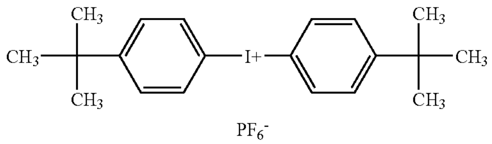

[OI-3]

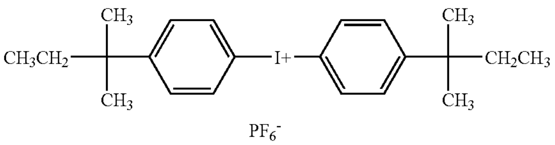

[OI-4]

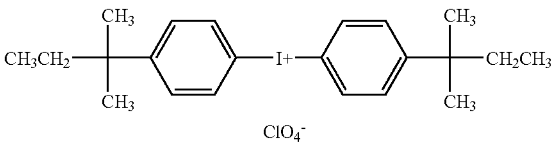

[OI-5]

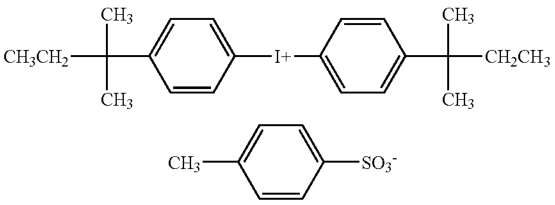

[OI-6]

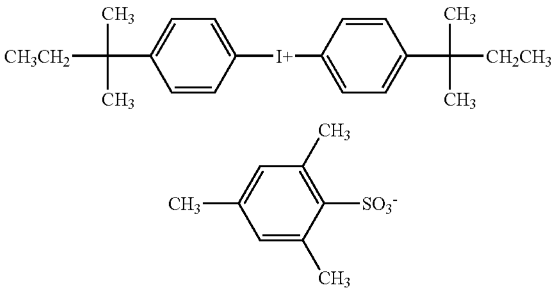

-continued
[OI-7]
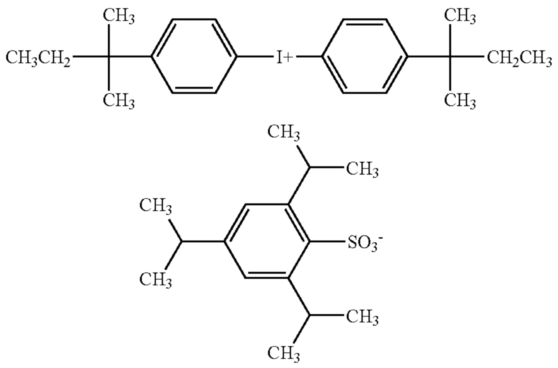
[OI-8]
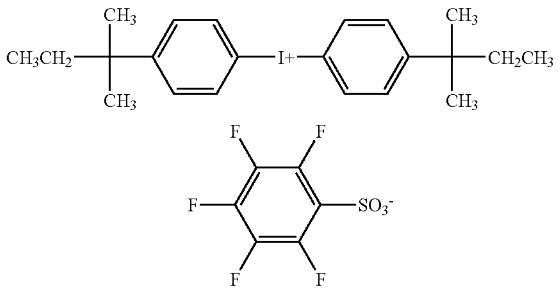
[OI-9]
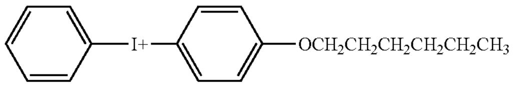
[OI-10]
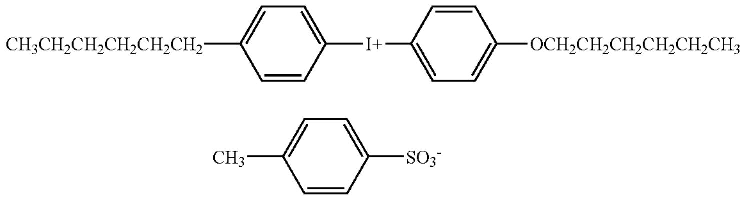
[ON-1]
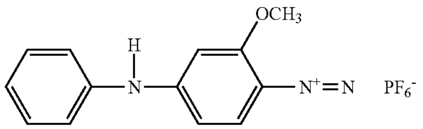
[ON-2]
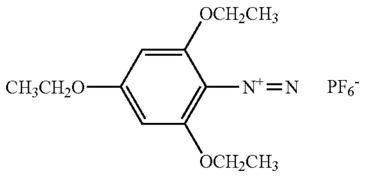
[ON-3]
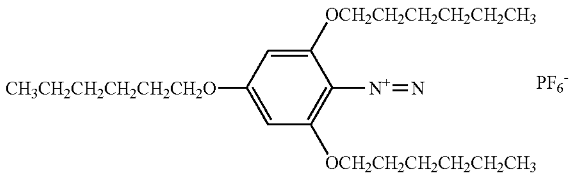
[ON-4]
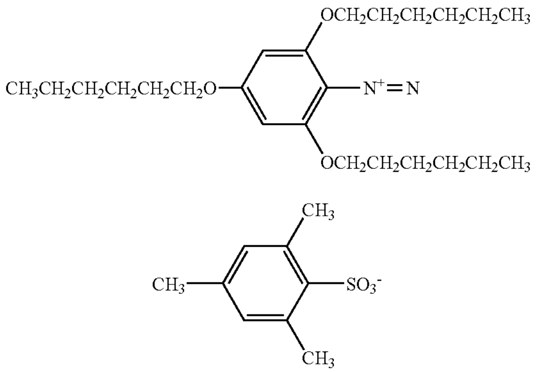

-continued
[ON-5]
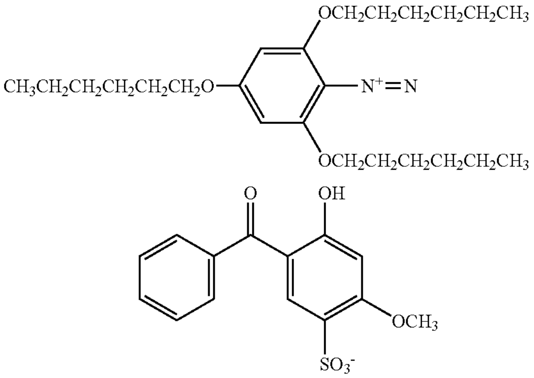
[OS-1]
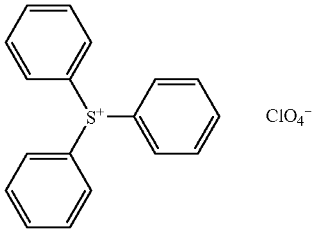
[OS-2]
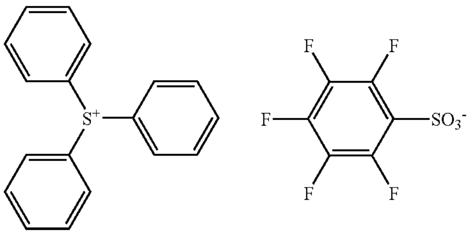
[OS-3]
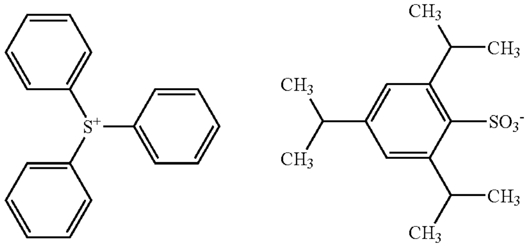
[OS-4]
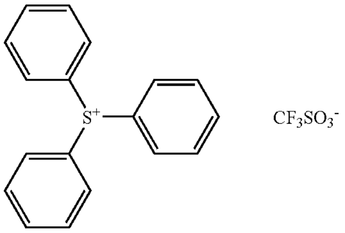
[OS-5]
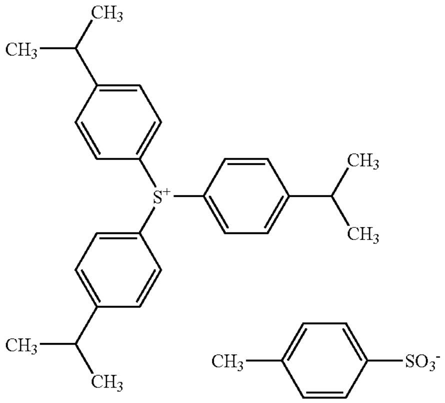
[OS-6]
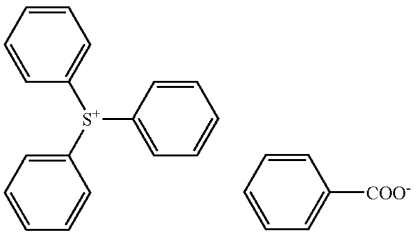
[OS-7]
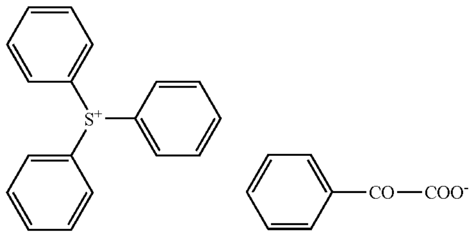

Other preferred radical generators include the specific aromatic sulfonium salts mentioned in JP 2002-148790 A, JP 2001-343742 A and JP 2002-6842 A.

Examples are given below of some typical compounds mentioned in JP 2002-148790 A that are other preferred radical generators suitable for use in the present invention.

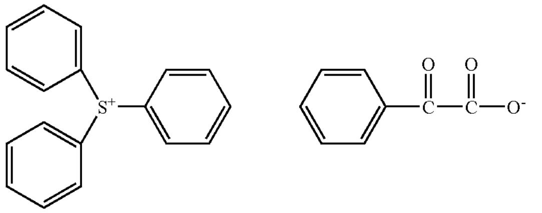

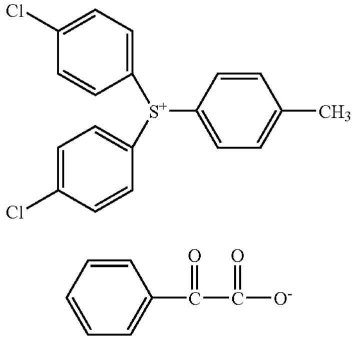

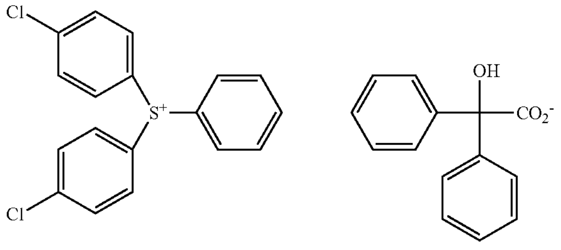

A single radical generator may be used alone, or two or more radical generators may be used together.

In the present invention, the above-described onium salts function not as acid generators, but rather as ionic initiators of radical polymerization.

Radical generators (B) that may be used in the present invention have a maximum absorption wavelength of preferably not more than 400 nm, more preferably not more than 330 nm, and even more preferably not more than 270 nm. By having the absorption wavelength fall within the ultraviolet range in this way, the image recording material can be handled under a white light.

The content of radical generator (B), based on the total solids in the image recording layer, is preferably 0.1 to 50 wt %, more preferably 0.5 to 30 wt %, and even more preferably 1 to 20 wt %. Within this range, the sensitivity of the image recording layer and the freedom of non-image areas of the layer from ink contamination during printing are especially good.

In the image recording layer, the radical generator may be added to the same layer as the other components, or it may be added to a different, separately provided layer such as the overcoat layer described later in this specification.

Radical Polymerizable Compound (C):

The radical polymerizable compound (C) used in the present invention is a radical polymerizable compound having at least one ethylenically unsaturated double bond, and is selected from among compounds having at least one, and preferably two or more, terminal ethylenically unsaturated bonds. Such compounds are widely used in industrial fields related to the present invention, and may be used herein without any particular limitation. These compounds have a variety of chemical forms, including monomers and prepolymers (e.g., dimers, trimers, and oligomers), as well as mixtures and copolymers thereof.

Examples of such monomers and copolymers thereof include unsaturated carboxylic acids (e.g., acrylic acid, methacrylic acid, itaconic acid, crotonic acid, isocrotonic acid, maleic acid), and their esters and amides. Preferred examples include esters of unsaturated carboxylic acids and aliphatic polyols, and amides of unsaturated carboxylic acids and aliphatic polyamines.

Preferred use can also be made of the addition reaction products of unsaturated carboxylic acid esters or amides having nucleophilic substituents such as hydroxy groups, amino groups and mercapto groups with monofunctional or polyfunctional isocyanates or epoxy compounds, or of the dehydration condensation reaction products of similarly substituted unsaturated carboxylic acid esters or amides with monofunctional or polyfunctional carboxylic acids. The addition reaction products of unsaturated carboxylic acid esters or amides having electrophilic substituents such as isocyanate groups or epoxy groups with monofunctional or polyfunctional alcohols, amines or thiols; and the substitution reaction products of unsaturated carboxylic acid esters or amides having eliminable substituents such as halogens or tosyloxy with monofunctional or polyfunctional alcohols, amines or thiols are also preferred. To cite further examples, use can also be made of the group of compounds in which the unsaturated carboxylic acid mentioned above has been replaced with, for example, an unsaturated phosphonic acid or styrene.

Specific examples of the esters of unsaturated carboxylic acids and aliphatic polyols are given below.

Acrylic acid esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomers.

Methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl] dimethylmethane.

Itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Crotonic acid esters include ethylene glycol dicrotonate, tetramethylene glycol dicrotonate, pentaerythritol dicrotonate and sorbitol tetradicrotonate.

Isocrotonic acid esters include ethylene glycol diisocrotonate, pentaerythritol diisocrotonate and sorbitol tetraisocrotonate.

Maleic acid esters include ethylene glycol dimaleate, triethylene glycol dimaleate, pentaerythritol dimaleate and sorbitol tetramaleate.

Preferred examples of other suitable esters include the aliphatic alcohol esters mentioned in JP 46-27926 B, JP 51-47334 B and JP 57-196231 A; esters having aromatic skeletons such as those mentioned in JP 59-5240 A, JP 59-5241 A and JP 2-226149 A; and the amino group-bearing esters mentioned in JP 1-165613 A.

Specific examples of amides of unsaturated carboxylic acids with aliphatic polyamines that may be used as monomers include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other suitable amide-type monomers include those having a cyclohexylene structure mentioned in JP 54-21726 B.

Urethane-type addition polymerizable compounds prepared using an addition reaction between an isocyanate group and a hydroxy group are also preferred. Specific examples include the vinylurethane compounds having two or more polymerizable vinyl groups per molecule which are mentioned in JP 48-41708 B and are obtained by adding a hydroxy group-bearing vinyl monomer of formula (VI) below to a polyisocyanate compound having at least two isocyanate groups per molecule.

$$CH_2{=}C(R^{41})COOCH_2CH(R^{42})OH \qquad (VI)$$

(In the formula, $R^{41}$ and $R^{42}$ each independently represent —H or —$CH_3$.)

Urethane acrylates such as those mentioned in JP 51-37193 A, JP 2-32293 B and JP 2-16765 B, and the urethane compounds having an ethylene oxide-type skeleton mentioned in JP 58-49860 B, JP 56-17654 B, JP 62-39417 B and JP 62-39418 B are also preferred.

Other preferred examples include the radical polymerizable compounds having within the molecule an amino structure or a sulfide structure that are mentioned in JP 63-277653 A, JP 63-260909 A and JP 1-105238 A.

Additional examples include polyfunctional acrylates or methacrylates, including polyester acrylates and epoxy acrylates obtained by reacting an epoxy resin with (meth)acrylic acid, such as those mentioned in JP 48-64183 A, JP 49-43191 B and JP 52-30490 B.

Further examples include the specific unsaturated compounds mentioned in JP 46-43946 B, JP 1-40337 B and JP 1-40336 B, and the vinylphosphonic acid compounds mentioned in JP 2-25493 A.

In some cases, it will be desirable to use the perfluoroalkyl group-containing structures mentioned in JP 61-22048 A.

Use can also be made of the photocurable monomers and oligomers mentioned in *Nippon Setchaku Kyokaishi* Vol. 20, No. 7, 300-308 (1984).

Details concerning use of the radical polymerizable compound (C), such as what type of structure it should have, whether to use one such compound alone or a combination of two or more thereof, and the amount of addition can be selected as desired in accordance with the performance characteristics intended for the recording material. For example, selection can be made based on the following considerations.

For good sensitivity, a structure having a high unsaturated group content per molecule is preferred. In most cases, a functionality of at least two is preferred. Moreover, to increase the strength of the image areas (i.e., the cured film), a functionality of three or more is desirable. Also effective are methods in which the strength is adjusted by using compounds having differing numbers of functional groups or differing polymerizable groups (e.g., acrylic acid ester compounds, methacrylic acid ester compounds, styrene compounds, vinyl ether compounds) in combination. Selection of the radical polymerizable compound and how it is used are also important factors affecting both the compatibility of the compound with other ingredients within the image recording layer (e.g., binder polymer, initiator, colorant) and its dispersibility. For instance, the compatibility can be enhanced by using a low-purity compound or by using two or more radical polymerizable compounds together. It is also possible to select a specific structure so as to enhance adhesion with the support or the overcoat layer.

In light of the above, it is usually preferable for the proportion of the radical polymerizable compound (C) to be within a range of 5 to 80 wt %, more preferable for 20 to 75 wt %, and even more preferable for 25 to 75 wt %, based on the total solids in the image recording layer. Such compounds may be used singly or as combinations of two or more thereof. With regard to the manner in which the radical polymerizable compound (C) is used, any suitable structure, formulation and amount of addition may be selected based on such considerations as the degree to which polymerization is inhibited by oxygen, the desired resolution of the printing plate, the tendency for fogging, changes in refractive index, and surface tackiness. In some cases, a layered construction that includes an undercoat and an overcoat, and corresponding methods of application, may be employed.

Binder Polymer (D):

In the practice of the present invention, it is desirable to use also a binder polymer (D) for such reasons as to enhance the film properties of the image recording layer. The use of a linear organic polymer as the binder polymer is preferred. Known linear organic polymers may be used for this purpose.

Although, as just noted, the purpose of using a binder is primarily to improve the film properties, the addition of an oleophilic binder is effective also for enhancing the dispersibility of unexposed areas of the image recording layer in ink. Exemplary binders of this type include polyvinylacetal resins, polyurethane resins, polyamide resins, epoxy resins, acrylic resins, methacrylic resins, polystyrene resins, novolak-type phenolic resins, polyurea resins, polyimide resins, polyester resins, synthetic rubbers and natural rubbers.

These binders preferably have crosslinkability. To confer the binder with crosslinkability, crosslinkable functional groups such as ethylenically unsaturated bonds may be introduced onto the polymer main chain or side chains. Crosslinkable functional groups may be introduced by copolymerization.

Illustrative examples of polymers having ethylenically unsaturated bonds on the main chain of the molecule include poly-1,4-butadiene and poly-1,4-isoprene.

Examples of polymers having ethylenically unsaturated bonds on side chains of the molecule include polymers of acrylic acid or methacrylic acid esters or amides, in which the ester or amide residues (the "R" in —COOR or —CONHR) have an ethylenically unsaturated bond.

Exemplary residues (the above-mentioned "R") having ethylenically unsaturated bonds include $-(CH_2)_nCR^1=CR^2R^3$, $-(CH_2O)_nCH_2CR^1=CR^2R^3$, $-(CH_2CH_2O)_nCH_2CR^1=CR^2R_3$, $-(CH_2)_nNH-CO-O-CH_2CR^1=CR^2R^3$, $-(CH_2)_n-O-CO-CR^1=CR^2R^3$ and $-(CH_2CH_2O)_2-X$ (wherein $R^1$ to $R^3$ each represents a hydrogen atom, a halogen atom, or an alkyl, aryl, alkoxy or aryloxy group of 1 to 20 carbons, and $R^1$ may bond together with $R^2$ or $R^3$ to form a ring; the letter n is an integer from 1 to 10; and X is a dicyclopentadienyl residue).

Specific examples of suitable ester residues include $-CH_2CH=CH_2$ (mentioned in JP 7-21633 B), $-CH_2CH_2O-CH_2CH=CH_2$, $-CH_2C(CH_3)=CH_2$, $-CH_2CH=CH-C_6H_5$, $-CH_2CH_2OCOCH=CH-C_6H_5$, $-CH_2-NHCOO-CH_2CH=CH_2$ and $-CH_2CH_2O-X$ (wherein X is a dicyclopentadienyl residue).

Specific examples of suitable amide residues include $-CH_2CH=CH_2$, $-CH_2CH_2-Y$ (wherein Y is a cyclohexene residue) and $-CH_2CH_2-OCO-CH=CH_2$.

The binder polymer having crosslinkability is cured by, for example, the addition of free radicals (polymerization initiating radicals, or propagation radicals during polymerization of the polymerizable compound) to the crosslinkable functional groups on. the polymer to effect addition polymerization, either directly between polymers or via polymerized chains of the polymerizable compounds. Alternatively, the binder polymer having crosslinkability is cured when atoms on the polymer (e.g., hydrogen atoms on carbon atoms adjacent to the crosslinkable functional groups) are pulled off by free radicals, thereby forming polymer radicals which bond to each other, resulting in the formation of crosslinks between the polymer molecules.

The content of the crosslinkable groups in the binder polymer (content of radical-polymerizable unsaturated double bonds, as determined by iodine titration) is preferably 0.1 to 10.0 mmol, more preferably 1.0 to 7.0 mmol, and even more preferably 2.0 to 5.5 mmol, per gram of the binder polymer. The sensitivity of the image recording layer and the shelf stability of the image recording layer-forming coating liquid are particularly good within this range.

A hydrophilic polymer may be added to enhance the developability of the exposed plate with dampening water rather than ink. Preferred examples include binders having hydrophilic groups such as hydroxy, carboxy, hydroxyethyl, hydroxypropyl, amino, aminoethyl, aminopropyl, carboxymethyl, sulfo or phosphoryl.

Specific examples of such binders include gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetates having a degree of hydrolysis of at least 60 wt %, and preferably at least 80 wt %, polyvinyl formal, polyvinyl butyral, polyvinyl pyrrolidone, the homopolymers and copolymers of acrylamides, the homopolymers and copolymers of methacrylamides, and the homopolymers and copolymers of N-methylolacrylamide.

In addition, examples of useful water-soluble linear organic polymers include polyvinylpyrrolidone and polyethylene oxide. The use of, for example, an alcohol-soluble nylon or a polyether of 2,2-bis(4-hydroxyphenyl)propane with epichlorohydrin is effective for enhancing the strength of the cured film.

Because the image recording layer must be made ink-receptive, an oleophilic, water-insoluble binder is preferable to a hydrophilic water-soluble binder as the binder polymer (D).

The binder polymer (D) has a weight-average molecular weight of preferably at least 5,000, and more preferably from 10,000 to 300,000, and has a number-average molecular weight of preferably at least 1,000, and more preferably from 2,000 to 250,000. The polydispersity (weight-average molecular weight/number-average molecular weight) is preferably from 1.1 to 10.

The binder polymer (D) may be a random polymer, a block polymer, a graft polymer or the like. A random polymer is preferred.

The binder polymer (D) can be synthesized by a method known to the art. Examples of solvents that may be used during synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. These may be used singly or as mixtures of two or more thereof.

Radical polymerization initiators that may be used when synthesizing the binder polymer (D) include known compounds such as azo initiators and peroxide initiators.

The binder polymer (D) may be used singly or as a mixture of two or more thereof.

The content of binder polymer (D) is preferably at least 10 wt %, more preferably at least 20 wt %, even more preferably at least 30 wt %, and preferably at most 95 wt %, more preferably at most 90 wt %, even more preferably at most 80 wt %, further preferably at most 70 wt %, based on the total solids in the image recording layer. A content within this range provides an image area strength and image forming properties which are particularly good.

It is preferable to use the radical polymerizable compound (C) and the binder polymer (D) in a weight ratio of 1/9 to 7/3.

Surfactant:

The use in the image recording layer of a surfactant is desirable for promoting the on-machine developability of the exposed plate at the start of printing and enhancing the coating surface shape. Exemplary surfactants include nonionic surfactants, anionic surfactants, cationic surfactants, amphoteric surfactants and fluorine-containing surfactants. Use may be made of a single surfactant or a combination of two or more surfactants.

Any known nonionic surfactant may be used in the present invention without particular limitation. Specific examples include polyoxyethylene alkyl ethers, polyoxyethylene alkylphenyl ethers, polyoxyethylene polystyrylphenyl ethers, polyoxyethylene polyoxypropylene alkyl ethers, partial fatty acid esters of glycerol, partial fatty acid esters of sorbitan, partial fatty acid esters of pentaerythritol, fatty acid monoesters of propylene glycol, partial fatty acid esters of sucrose, partial fatty acid esters of polyoxyethylene sorbitan, partial fatty acid esters of polyoxyethylene sorbitol, fatty acid esters of polyethylene glycol, partial fatty acid esters of polyglycerol, polyoxyethylenated castor oils, partial fatty acid esters of polyoxyethylene glycerol, fatty acid diethanolamides, N,N-bis-2-hydroxyalkylamines, polyoxyethylene alkyl amines, fatty acid esters of triethanolamine, trialkylamine oxides, polyethylene glycol, and copolymers of polyethylene glycol and polypropylene glycol.

Any known anionic surfactant may be used in the present invention without particular limitation. Specific examples include fatty acid salts, abietic acid salts, hydroxyalkanesulfonates, alkanesulfonates, dialkylsulfosuccinates, straight-chain alkylbenzenesulfonates, branched-chain alkylbenzenesulfonates, alkylnaphthalenesulfonates, alkylphenoxypolyoxyethylene propylsulfonates, polyoxyethylene alkylsulfophenyl ether salts, sodium N-methyl-N-oleyltaurate, the disodium salts of N-alkylsulfosuccinic acid monoamides, petroleum sulfonates, sulfated tallow oil, the sulfate esters of fatty acid alkyl esters, alkyl sulfates, polyoxyethylene alkyl ether sulfates, fatty acid monoglyceride sulfates, polyoxyethylene alkylphenyl ether sulfates, polyoxyethylene styrylphenyl ether sulfates, alkyl phosphates, polyoxyethylene alkyl ether phosphates, polyoxyethylene alkylphenyl ether phosphates, partially saponified styrene/maleic anhydride copolymers, partially saponified olefin/maleic anhydride copolymers and naphthalenesulfonic acid-formalin condensates.

Any known cationic surfactant may be used in the present invention without particular limitation. Examples include alkylamine salts, quaternary ammonium salts, polyoxyethylene alkylamine salts and polyethylene polyamine derivatives.

Any known amphoteric surfactant may be used in the present invention without particular limitation. Examples include carboxybetaines, aminocarboxylic acids, sulfobetaines, aminosulfates and imidazolines.

In the surfactants mentioned above, the term “polyoxyethylene” may be substituted with the more general term “polyoxyalkylene,” additional examples of which include polyoxymethylene, polyoxypropylene and polyoxybutylene. Surfactants containing these latter polyoxyalkylene groups can likewise be used in the present invention.

Even more preferable surfactants include fluorine-containing surfactants having perfluoroalkyl groups on the molecule. Examples of such fluorine-containing surfactants include anionic surfactants such as perfluoroalkylcarboxylates, perfluoroalkylsulfonates and perfluoroalkylphosphates; amphoteric surfactants such as perfluoroalkylbetains; cationic surfactants such as perfluoroalkyltrimethylammonium salts; and nonionic surfactants such as perfluoroalkylamine oxides, perfluoroalkylethylene oxide adducts, oligomers containing perfluoroalkyl groups and hydrophilic groups, oligomers containing perfluoroalkyl groups and lipophilic groups, oligomers containing perfluoroalkyl groups, hydrophilic groups and lipophilic groups, and urethanes containing perfluoroalkyl groups and lipophilic groups. Preferred examples include the fluorine-containing surfactants mentioned in JP 62-170950 A, JP 62-226143 A and JP 60-168144 A.

The surfactant may be used singly or as a combination of two or more thereof.

The surfactant content is preferably from 0.001 to 10 wt %, and more preferably from 0.01 to 5 wt %, based on the total solids in the image recording layer.

Colorant:

In the practice of the present invention, aside from the above, various other compounds may also be added if necessary. For instance, dyes having a large absorption in the visible light range can be used as image colorants. Specific examples include Oil Yellow #101, Oil Yellow #103, Oil Pink #312, Oil Green BG, Oil Blue BOS, Oil Blue #603, Oil Black BY, Oil Black BS and Oil Black T-505 (all of which are produced by Orient Chemical Industries, Ltd.); and also Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), and the dyes mentioned in JP 62-293247 A. Preferred use can also be made of pigments such as phthalocyanine pigments, azo pigments, carbon black and titanium oxide.

The addition of these colorants is desirable because they enable image areas and non-image areas to be easily distinguished from each other following image formation. The amount of such addition is typically 0.01 to 10 wt %, based on the total solids in the image recording material.

Visualizing Agent:

An acid- or radical-responsive chromogenic compound may be added to the image recording layer in order to form a visual image. Examples of such compounds which can be effectively used for this purpose include diphenylmethane, triphenylmethane, thiazine, oxazine, xanthene, anthraquinone, iminoquinone, azo and azomethine dyes.

Specific examples include dyes such as Brilliant Green, Ethyl Violet, Methyl Green, Crystal Violet, Basic Fuchsin, Methyl Violet 2B, Quinaldine Red, Rose Bengal, Metanil Yellow, thymolsulfophthalein, Xylenol Blue, Methyl Orange, Paramethyl Red, Congo Red, Benzopurpurin 4B, α-Naphthyl Red, Nile Blue 2B, Nile Blue A, Methyl Violet, Malachite Green, Parafuchsin, Victoria Pure Blue BOH (produced by Hodogaya Chemical Co., Ltd.), Oil Blue #603 (Orient Chemical Industries, Ltd.), Oil Pink #312 (Orient Chemical Industries), Oil Red 5B (Orient Chemical Industries), Oil Scarlet #308 (Orient Chemical Industries), Oil Red OG (Orient Chemical Industries), Oil Red RR (Orient Chemical Industries), Oil Green #502 (Orient Chemical Industries), Spiron Red BEH Special (Hodogaya Chemical), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl) aminophenyliminonaphthoquinone, 1-phenyl-3-methyl-4-p-diethylaminophenylimino-5-pyrazolone and 1-β-naphthyl-4-p-diethylaminophenylimino-5-pyrazolone; and leuco dyes such as p,p',p"-hexamethyltriaminotriphenylmethane (Leuco Crystal Violet) and Pergascript Blue SRB (Ciba Geigy).

Aside from the above, advantageous use can also be made of leuco dyes known to be used in heat-sensitive or pressure-sensitive paper. Specific examples include Crystal Violet Lactone, Malachite Green Lactone, Benzoyl Leucomethylene Blue, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyridino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide and 3-(4-diethylaminophenyl)-3-(l-ethyl-2-methylindol-3-yl) phthalide.

The acid- or radical-responsive chromogenic dye is preferably added in a ratio of 0.01 to 10 wt %, based on the total solids in the image recording layer.

Polymerization Inhibitor:

To prevent unwanted thermal polymerization of the radical polymerizable compound (C) during production or storage of the image recording layer, it is desirable to add a small amount of thermal polymerization inhibitor to the image recording layer.

Preferred examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and the aluminum salt of N-nitroso-N-phenylhydroxylamine.

The thermal polymerization inhibitor is added in an amount of preferably about 0.01 to about 5 wt %, based on the total solids in the image recording layer.

Higher Fatty Acid Derivative or the like:

To prevent the inhibition of polymerization by oxygen, a higher fatty acid derivative or the like such as behenic acid or behenamide may be added so as to concentrate primarily at the surface of the image recording layer as the layer dries after coating. The higher fatty acid derivative is added in an amount of preferably about 0.1 to about 10 wt %, based on the total solids in the image recording layer.

Plasticizer:

The image recording layer may also contain a plasticizer to improve the on-machine developability.

Preferred examples of the plasticizer include phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate and diallyl phthalate; glycol esters such as dimethyl glycol phthalate, ethyl phthalyl ethyl glycolate, methyl phthalyl ethyl glycolate, butyl phthalyl butyl glycolate, and triethylene glycol dicaprylate; phosphoric acid esters such as tricresyl phosphate and triphenyl phosphate; dibasic fatty acid esters such as diisobutyl adipate, dioctyl adipate, dimethyl sebacate, dibutyl sebacate, dioctyl azelate and dibutyl maleate; and polyglycidyl methacrylate, triethyl citrate, triacetyl glycerine and butyl laurate.

The plasticizer content is preferably not more than about 30 wt %, based on the total solids in the image recording layer.

Fine Inorganic Particles:

The image recording layer may contain fine inorganic particles.

Preferred examples include finely divided silica, alumina, magnesium oxide, titanium oxide, magnesium carbonate, calcium alginate, and mixtures thereof. Even if these are not capable of photothermal conversion, they can be used for such purposes as reinforcing the film and enhancing interfacial adhesion from surface graining.

The inorganic particles have an average size of preferably 5 nm to 10 μm, and more preferably 0.5 μm to 3 μm. Within this range, they disperse stably in the image recording layer, enabling the image recording layer to maintain a sufficient degree of film strength and enabling the formation of non-image areas having excellent hydrophilic properties that are not easily contaminated by ink during printing.

Such inorganic particles are readily available as colloidal silica dispersions and other commercial products.

The content of these fine inorganic particles is preferably not more than 20 wt %, and more preferably not more than 10 wt %, based on the total solids in the image recording layer.

Low-Molecular-Weight Hydrophilic Compound.

To improve the on-machine developability of the presensitized plate, the image recording layer may contain a hydrophilic low-molecular-weight compound. Illustrative examples of suitable hydrophilic low-molecular-weight compounds include the following water-soluble organic compounds: glycols such as ethylene glycol, diethylene glycol, triethylene glycol, propylene glycol, dipropylene glycol and tripropylene glycol, as well as ether or ester derivatives thereof; polyhydroxy compounds such as glycerol and pentaerythritol; organic amines such as triethanolamine, diethanolamine and monoethanolamine, as well as salts thereof; organic sulfonic acids such as toluenesulfonic acid and benzenesulfonic acid, as well as salts thereof; organic phosphonic acids such as phenylphosphonic acid, as well as salts thereof; and organic carboxylic acids such as tartaric acid, oxalic acid, citric acid, malic acid, lactic acid, gluconic acid and amino acids, as well as salts thereof.

Additives other than the constituents described above may also be included in the image recording layer.

Formation of Image Recording Layer:

In the practice of the present invention, any of various approaches may be used for incorporating the above constituents in the image recording layer.

According to one approach, described in JP 2002-287334 A, the above ingredients are dispersed or dissolved in a solvent to form an image recording layer-forming coating liquid. The coating liquid is applied onto the subsequently described support and dried, thereby forming an image recording layer. This method provides a molecular dispersion-type image recording layer.

Illustrative, non-limiting examples of the solvent include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene, acetone and water. These may be used alone or as mixtures of two or more thereof.

The image recording layer-forming coating liquid has a solid concentration of preferably 1 to 50 wt %.

In another approach, described in JP 2001-277740 A and JP 2001-277742 A, the image recording layer is formed after encapsulating some or all of the ingredients described above within microcapsules. This method provides a microcapsule-type image recording layer. This type of image recording layer is advantageous for achieving a better on-machine developability. It is especially preferable for at least some of the infrared absorber (A), the radical generator (B) and the radical polymerizable compound (C) to be microencapsulated.

In a microcapsule-type image recording layer, the various ingredients mentioned above may be entirely microencapsulated or portions thereof may be included outside of the microcapsules.

A known method may be used for microencapsulating the ingredients. Illustrative, non-limiting examples of techniques for preparing microcapsules include the methods involving the use of coacervation described in U.S. Pat. No. 2,800,457 and U.S. Pat. No. 2,800,458; the methods that rely on interfacial polymerization described in U.S. Pat. No. 3,287,154, JP 38-19574 B and JP 42-446 B; the methods involving polymer precipitation described in U.S. Pat. No. 3,418,250 and U.S. Pat. No. 3,660,304; the method that uses an isocyanate polyol wall material described in U.S. Pat. No. 3,796,669; the method that uses an isocyanate wall material described in U.S. Pat. No. 3,914,511; the methods that use a urea-formaldehyde or urea formaldehyde-resorcinol wall-forming material which are described in U.S. Pat. Nos. 4,001,140, 4,087,376 and 4,089,802; the method which uses wall materials such as melamine-formaldehyde resins and hydroxycellulose that is described in U.S. Pat. No. 4,025,445; the in situ methods involving monomer polymerization that are taught in JP 36-9163 B and JP 51-9079 B; the spray drying methods described in GB 930,422 B and U.S. Pat. No. 3,111,407; and the electrolytic dispersion cooling methods described in GB 952,807 B and GB 967,074 B.

Microcapsule walls preferred for use in the present invention are those which have three-dimensional crosslinkages and are solvent-swellable. Accordingly, it is preferable for the microcapsule wall material to be polyurea, polyurethane, polyester, polycarbonate, polyamide or a mixture thereof. Polyurea and polyurethane are especially preferred. The microcapsule wall may have introduced therein a compound having crosslinkable functional groups such as ethylenically unsaturated bonds that enables introduction of the above-described binder polymers.

The microcapsule is preferably one having an average particle size of 0.01 to 3.0 μm, more preferably 0.05 to 2.0 μm, and even more preferably 0.10 to 1.0 μm. Within the above range, it is possible to obtain a good printing plate resolution and a good stability over time of the image recording layer-forming coating liquid.

Coating Method:

The coating amount (solids content) used to form the image recording layer varies depending on the application, although an amount of 0.3 to 3.0 $g/m^2$ is generally preferred. Too small a coating amount will result in a large apparent sensitivity, but diminish the film properties of the image recording layer.

Any of various coating methods may be used. Examples of suitable methods of coating include bar coating, spin coating, spray coating, curtain coating, dip coating, air knife coating, blade coating and roll coating.

The image recording layer may be formed by preparing multiple kinds of coating liquid, and applying and drying repeatedly.

Undercoat Layer:

In the presensitized plate of the present invention, if necessary, an undercoat layer may be provided between the image recording layer and the support. The undercoat layer functions as a heat-insulating layer so that the heat generated by exposure to the infrared laser is efficiently utilized without diffusing into the support, thus helping to achieve a higher sensitivity. Moreover, in non-image areas, the undercoat layer facilitates separation of the image recording layer from the support, improving the on-machine developability.

The undercoat layer preferably contains a compound having a polymerizable group on the molecule. Specific preferred examples include the addition polymerizable ethylenic double bond reactive group-bearing silane coupling agents and the ethylenic double bond reactive group-bearing phosphorus compounds mentioned in JP 10-282679 A.

The coating amount (solids) used to form the undercoat layer is preferably from 0.1 to 100 $mg/m^2$, and more preferably from 3 to 30 $mg/M^2$.

The compound used to form the undercoat layer has a greater adsorptivity to the support the higher its molecular weight, and is therefore preferably a polymeric compound.

Moreover, it is desirable that the compound used in the undercoat layer have groups which can be adsorbed onto the support, referred to hereinafter as "support-adsorbable groups." These are groups which typically form ionic bonds, hydrogen bonds, coordinate bonds or bonds due to intermolecular forces with, for example, metals, metal oxides or hydroxy groups that are present on the support after it has been administered treatment such as anodizing or hydrophilizing treatment.

The support-adsorbable groups preferably have an acid group or an onium group on the molecule.

The acid group is preferably a group having an acid dissociation constant ($pK_a$) of not more than 7. Specific examples include $-COOH$, $-SO_3H$, $-OSO_3H$, $-PO_3H_2$, $-OPO_3H_2$, $-CONHSO_2-$ and $-SO_2NHSO_2-$. Of these, $-PO_3H_2$ is especially preferred.

The onium group is preferably one containing atoms from Group 15 (5B) or 16 (6B) of the Periodic Table. Of these, onium groups containing a nitrogen, phosphorus or sulfur atom are preferred. Onium groups containing a nitrogen atom are especially preferred.

Examples of polymerizable groups that can be included in the compound used in the undercoat layer include addition polymerization reactive groups such as alkenyl groups and alkynyl groups. Illustrative, non-limiting examples of alkenyl groups include vinyl, propenyl, allyl, butenyl and dialkylmaleimide groups. Illustrative, non-limiting examples of alkynyl groups include acetylene and alkylacetylene groups.

Of these groups, especially preferred examples are vinyl, propenyl, allyl, acrylic (which is a derivative of the vinyl group), and methacrylic (which is a derivative of the propenyl group) groups.

The compound used in the undercoat layer preferably has a hydrophilicity conferring group on the molecule. Preferred examples of hydrophilicity conferring groups include ethylene oxide groups of the following formula $$-(OCH_2CH_2)_n-$$

(wherein n is an integer from 1 to 50, and preferably from 1 to 20).

The presence of an ethylene oxide group on the molecule is desirable because it greatly promotes the on-machine developability of the image recording layer.

In this invention, the presence or absence of adsorptivity to the support can be determined by a method such as the following.

A coating fluid is prepared by dissolving the test compound in a solvent with good solubility. The coating fluid is then coated onto the support such as to give a dry coated weight of 30 $mg/m^2$, and dried. The support on which the test compound has been coated is thoroughly cleaned with the solvent with good solubility, following which the residual amount of test compound that has not been washed away is measured, and the amount of adsorption to the support is computed. Measurement of the residual amount of compound can be carried out directly by determining the amount of compound remaining on the support, or indirectly by computation after first determining quantitatively the amount of test compound dissolved in the washings. Methods for quantitatively determining the compound include fluorescent x-ray analysis, reflectance spectrophotometry and liquid chromatography. In the present invention, "compounds having absorptivity to the support" refers to compounds which remain on the support in an amount of at least 15 $mg/m^2$ even when washing treatment is carried out as described above.

Specific, non-limiting, examples of compounds that are absorbable onto the support include compounds [A] to [Q] listed below.

[A] $CH_2{=}C(CH_3)COO(C_2H_4O)_nP{=}O(OH)_2$ n=1: Phosmer M (produced by Uni-Chemical Co., Ltd.), Kayamer PM-1 (Nippon Kayaku Co., Ltd.), Light-Ester P-M (Kyoeisha Chemical Co., Ltd.), NK Ester SA (Shin-Nakamura Chemical Co., Ltd.)

n=2: Phosmer PE2 (Uni-Chemical Co., Ltd.)

n=4 to 5: Phosmer PE (Uni-Chemical Co., Ltd.)

n=8: Phosmer PE8 (Uni-Chemical Co., Ltd.)

[B] $[CH_2{=}C(CH_3)COO(C_2H_4O)_n]_mP{=}O(OH)_{3-m}$

Mixture of n=1 and m=1 and 2 compounds: MR-200 (Daihachi Chemical Industry Co., Ltd.)

[C] $CH_2{=}CHCOO(C_2H_4O)_nP{=}O(OC_4H_9)_2$ n=1: Phosmer A (Uni-Chemical Co., Ltd.), Light-Ester P-A (Kyoeisha Chemical Co., Ltd.)

[D] $[CH_2{=}CHCOO(C_2H_4O)_n]_mP{=}O(OH)_{3-m}$

Mixture of n=1 and m=1 and 2 compounds: AR-200 (Daihachi Chemical Industry Co., Ltd.)

[E] $CH_2{=}C(CH_3)COO(C_2H_4O)_nP{=}O(OC_4H_9)_2$ n=1: MR-204 (Daihachi Chemical Industry Co., Ltd.)

[F] $CH_2{=}CHCOO(C_2H_4O)_nP{=}O(OC_4H_9)_2$ n=1: AR-204 (Daihachi Chemical Industry Co., Ltd.)

[G] $CH_2{=}C(CH_3)COO(C_2H_4O)_nP{=}O(OC_8H_{17})_2$ n=1: MR-208 (Daihachi Chemical Industry Co., Ltd.)

[H] $CH_2{=}CHCOO(C_2H_4O)_nP{=}O(OC_8H_{17})_2$ n=1: AR-208 (Daihachi Chemical Industry Co., Ltd.)

[I] $CH_2{=}C(CH_3)COO(C_2H_4O)P{=}O(OH)(ONH_3C_2H_4OH)$ n=1: Phosmer MH (Uni-Chemical Co., Ltd.)

[J] $CH_2{=}C(CH_3)COO(C_2H_4O)_nP{=}O(OH)(ONH\ (CH_3)_2C_2H_4OCOC\ (CH_3){=}CH_2)$ n=1: Phosmer DM (Uni-Chemical Co., Ltd.)

[K] $CH_2{=}C(CH_3)COO(C_2H_4O)_nP{=}O(OH)(ONH(C_2H_5)_2C_2H_4OCOC(CH_3){=}(CH_2)$ n=1: Phosmer DE (Uni-Chemical Co., Ltd.)

[L] $CH_2{=}CHCOO(C_2H_4O)_nP{=}O(O\text{-}ph)_2$ (where "ph" represents a benzene ring)

n=1: AR-260 (Daihachi Chemical Industry Co., Ltd.)

[M] $CH_2{=}C(CH_3)COO(C_2H_4O)_nP{=}O(O\text{-}ph)_2$ (where "ph" represents a benzene ring)

n=1: MR-260 (Daihachi Chemical Industry Co., Ltd.)

[N] $[CH_2{=}C(CH_3)COO(C_2H_4O)_n]_2P{=}O(OH)$ n=1: MR-200 (Daihachi Chemical Industry Co., Ltd.), Kayamer PM-2 (Nippon Kayaku Co., Ltd.), Kayamer PM-21 (Nippon Kayaku Co., Ltd.)

[O] $[CH_2{=}CHCOO(C_2H_4O)_{n]3}P{=}O$ n=1: Viscoat 3PA (Osaka Organic Chemical Industry Ltd.)

[P] $[CH_2{=}CHCOO(C_2H_4O)_{n]2}P{=}O(OC_4H_9)$ n=1: PS-A4 (Daihachi Chemical Industry Co., Ltd.)

Commercial products that may be used include but are not limited to the above compounds.

These phosphorus compounds can be synthesized by, as with ordinary acrylic monomers, a dehydration reaction between acrylic acid or methacrylic acid and a phosphoric acid compound, or by transesterification, in the manner described in *Jikken Kagaku Kōza* [Lectures in experimental chemistry] or *Shigaisen Kōka Shisutemu* [Ultraviolet curing systems] by Kiyoshi Kato. Alternatively, the phosphorus compound may be used as a mixture of several compounds in any suitable ratio. As the number represented by the ethylene oxide chain length n in the above formulas becomes larger, it becomes increasingly difficult to synthesize pure product; instead, there is obtained a mixture of compounds having about the desired chain length. Illustrative, non-limiting examples of specific chain length numbers n include 0, 1, 2, about 4 to 5, about 5 to 6, about 7 to 9, about 14, about 23, about 40 and about 50.

A plurality of these compounds may be mixed and used in any suitable proportion.

The undercoat layer may be formed by dissolving the above compound in water, an organic solvent such as methanol, ethanol or methyl ethyl ketone, or a mixed solvent thereof to form a coating fluid, then applying the coating fluid onto the support, and drying. Alternatively, the undercoat layer may be formed by dissolving the above compound in water, an organic solvent such as methanol, ethanol or methyl ethyl ketone, or a mixed solvent thereof to form a coating fluid, dipping the support in the coating fluid so that the compound is adsorbed onto the support, then using water or the like to rinse off excess fluid, and drying.

In the former method, solutions in which the concentration of the above compound is from 0.005 to 10 wt % can be applied by various methods, such as bar coating, spin coating, spray coating and curtain coating.

In the latter method, the solution concentration is preferably from 0.01 to 20 wt %, and more preferably 0.05 to 5 wt %. The dipping temperature is preferably 20 to 90° C., and more preferably 25 to 50° C. The dipping time is preferably 0.1 second to 20 minutes, and more preferably 2 seconds to 1 minute.

Protective Layer:

In the inventive presensitized plate of the present invention, a protective layer may optionally be provided on the image recording layer. In the practice of the present invention, exposure is ordinarily carried out under conditions open to the atmosphere. A protective layer prevents oxygen and low-molecular-weight compounds such as basic substances which are present in the atmosphere and would otherwise hinder the image-forming reactions triggered by light exposure within the image recording layer from entering the image recording layer, thus keeping the image-forming reactions triggered by exposure under open-air conditions from being hindered. Therefore the properties desired of the protective layer preferably include a low permeability to oxygen and such low-molecular-weight compounds, good transmittance to the light used for exposure, excellent adhesion to the image recording layer, and easy removal during on-machine development following exposure. Various protective layers endowed with such properties have been studied in the prior art and are described in detail in, for example, U.S. Pat. No. 3,458,311 and JP 55-49729 A.

Materials that may be used in the protective layer include water-soluble polymeric compounds having a relatively good crystallinity, such as polyvinyl alcohol, polyvinyl pyrrolidone, acidic celluloses, gelatin, gum arabic and polyacrylic acid. Of these, the use of polyvinyl alcohol (PVA) as the primary component provides the best results with respect to basic properties such as the oxygen barrier properties and removability of the protective layer during development. So long as the polyvinyl alcohol includes unsubstituted vinyl alcohol units which provide the protective layer with the required oxygen barrier properties and water solubility, some of the vinyl alcohol units may be substituted with esters, ethers or acetals, and the layer may include also other copolymerizable components.

It is preferable for the polyvinyl alcohol to be 71 to 100% hydrolyzed and to have a molecular weight in a range of 300 to 2,400. Specific examples of such polyvinyl alcohols include the following, all produced by Kuraray Co., Ltd.: PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8.

Conditions such as the protective layer ingredients (choice of PVA, use of additives, etc.) and coating amount may be suitably selected after taking into consideration not only the oxygen barrier properties and the removability during development, but also other characteristics, including the antifogging properties, adhesion, and scuff resistance of the protective layer. In general, a higher percent hydrolysis of the PVA (i.e., a higher content of unsubstituted vinyl alcohol units in the protective layer) and a greater film thickness provides higher oxygen barrier properties, resulting in better sensitivity. However, excessively high oxygen barrier properties may give rise to undesirable polymerization reactions during production and storage, to fogging during imagewise exposure, and to thick image lines and other unwanted effects. In addition, other properties, including adhesion to image areas and scuff resistance, are also extremely important in the handling of the presensitized plate. That is, when the protective layer which is hydrophilic because it contains a water-soluble polymeric compound, is laminated onto the oleophilic image recording layer, the protective layer has a tendency to delaminate owing to insufficient adhesion. In areas of delamination, defects such as poor curing of the film arise due to the inhibition of polymerization by oxygen.

Various means have been devised for improving adhesion between the image recording layer and the protective layer. For example, JP 49-70702 A and GB 1,303,578 A mention that sufficient adhesion can be achieved by mixing 20 to 60 wt % of an acrylic emulsion or a water-insoluble vinyl pyrrolidone-vinyl acetate copolymer into a hydrophilic polymer composed primarily of polyvinyl alcohol, and laminating the resulting mixture as a film onto the image recording layer. Any such known art may be employed for this purpose when working the present invention. Specific examples of methods that may be used to apply the protective layer are described in U.S. Pat. No. 3,458,311 and JP 55-49729 A.

Other functions may also be imparted to the protective layer. For example, by adding a colorant (e.g., a water-soluble dye) which has an excellent transmittance to the infrared light used for exposure and can efficiently absorb light of other wavelengths, the amenability of the presensitized plate to handling under a safelight can be improved without lowering sensitivity.

Support:

The support used in the presensitized plate of the present invention may be any dimensionally stable sheet or plate without particular limitation. Illustrative examples include paper, paper laminated with plastic (e.g., polyethylene, polypropylene, polystyrene), sheet metal (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film on which the above metals have been laminated or vapor deposited. Preferred supports include polyester film and aluminum sheet. Of these, aluminum sheet is especially preferred for its good dimensional stability and relatively low cost.

The aluminum sheet may be a sheet of pure aluminum, an alloy sheet composed primarily of aluminum but containing small amounts of other elements, or plastic laminated onto a thin film of aluminum or aluminum alloy. Other elements that may be present in the aluminum alloy include silicon, iron, manganese, copper, magnesium, chromium, zinc, bismuth, nickel and titanium and the like. It is preferable for the content of other elements in the alloy to be not more than 10 wt %. In the present invention, a pure aluminum sheet is preferred. However, because completely pure aluminum is difficult to manufacture for reasons having to do with refining technology, the presence of a small amount of other elements is acceptable. The aluminum sheet needs not have a specific composition, suitable use being possible of any material of the above type that is known and used in the art.

The support has a thickness of preferably 0.1 to 0.6 mm, more preferably 0.15 to 0.4 mm, and even more preferably 0.2 to 0.3 mm.

The aluminum sheet, prior to being used, is preferably administered surface treatment such as graining treatment or anodizing treatment. Surface treatment improves the hydrophilic properties and makes it easy to ensure good adhesion between the image recording layer and the support. Before the aluminum sheet is subjected to graining treatment, the surface may optionally be degreased such as with a surfactant, an organic solvent or an alkaline aqueous solution to remove rolling oils from the surface.

Graining treatment of the aluminum sheet surface may be carried out by various methods, such as mechanical graining, electrochemical graining (in which the surface is electrochemically dissolved) and chemical graining (in which the surface is selectively dissolved chemically).

A known method of mechanical graining may be used, such as ball graining, brush graining, blast finishing or buffing.

Suitable methods for electrochemical graining include methods carried out with alternating current or direct current in an electrolytic solution containing an acid such as hydrochloric aid or nitric acid. Also suitable are methods which use mixed acids, like that described in JP 54-63902 A.

If necessary, the aluminum sheet that has been grained is subjected to alkali etching treatment using an aqueous solution of, for example, potassium hydroxide or sodium hydroxide. In addition, the alkali etched sheet, after it has been neutralized, may optionally be subjected to anodizing treatment to increase the wear resistance.

Various electrolytes capable of forming a porous oxide film may be used in anodizing treatment of the aluminum sheet. Sulfuric acid, hydrochloric acid, oxalic acid, chromic acid or mixtures thereof may generally be used. The concentrations of these electrolytes are set as appropriate for the type of electrolyte.

The anodizing treatment conditions vary empirically depending on the particular electrolyte used, although it is generally preferable for the electrolyte concentration in the solution to be 1 to 80 wt %, the solution temperature to be 5 to 70° C., the current density to be 5 to 60 A/$dm^2$, the voltage to be 1 to 100 V, and the period of electrolysis to be from 10 seconds to 5 minutes. The weight of the anodized layer that forms is preferably 1.0 to 5.0 g/$m^2$, and more preferably 1.5 to 4.0 g/$m^2$.

After anodizing treatment has been carried out, if necessary, the surface of the aluminum sheet is subjected to hydrophilizing treatment. One suitable type of hydrophilizing treatment is an alkali metal silicate method of the sort described in U.S. Pat. No. 2,714,066, U.S. Pat. No. 3,181,461, U.S. Pat. No. 3,280,734 and U.S. Pat. No. 3,902,734. In this method, the support is subjected to immersion or electrolytic treatment in an aqueous solution of, for example, sodium silicate. Other types of hydrophilizing treatment include treatment with potassium hexafluorozirconate (IV) described in JP 36-22063 B, and treatment with polyvinylphosphonic acid described in U.S. Pat. No. 3,276,868, U.S. Pat. Nos. 4,153,461 and 4,689,272.

It is advantageous for the support to have a centerline average roughness of 0.10 to 1.2 μm.

The support has a color density, given as the reflection density, of preferably 0.15 to 0.65.

Back Coat:

Following surface treatment of the support or formation of an undercoat layer, a back coat may optionally be provided on the back side of the support.

Preferred examples of the back coat are the coats composed of organic polymeric compounds mentioned in JP 5-45885 A, and the coats composed of metal oxides obtained by the hydrolysis and polycondensation of organometallic compounds or inorganic metal compounds that are mentioned in JP 6-35174 A. Of these, silicon alkoxy compounds such as $Si(OCH_3)_4$, $Si(OC_2H_5)_4$, $Si(OC_3H_7)_4$ or $Si(OC_4H_9)_4$ are preferred owing to the low cost and ready availability of the starting materials.

Exposure

In the lithographic printing method of the present invention, the inventive presensitized plate described above is imagewise exposed using an infrared laser.

No particular limitation is imposed on the infrared laser used in the present invention, although solid lasers and semiconductor lasers which emit infrared light at a wavelength of 760 to 1200 nm are preferred. The infrared laser has an output of preferably at least 100 mW. To shorten the exposure time, the use of a multi-beam laser device is preferred.

The exposure time per pixel is preferably not more than 20 μs. The amount of emitted energy is preferably 10 to 300 mJ/$cm^2$.

Printing

In the lithographic printing method of the present invention, as described above, the inventive presensitized plate is imagewise exposed with an infrared laser, following which aqueous ingredients and an oil-based ink are supplied to the exposed plate and printing is carried out without passing through a separate development step.

Specific examples include methods in which the presensitized plate is exposed with an infrared laser, following which the plate is mounted on a printing press and printing is carried out without passing through a development step; and methods in which the presensitized plate is mounted on a printing press, then exposed on the press with an infrared laser and subsequently printed without passing through a development step.

When printing is carried out after imagewise exposure of the presensitized plate with an infrared laser followed by the supply of an aqueous component and an oil-based ink without passing through a development step such as wet development, in exposed areas of the image recording layer, the image recording layer cured by exposure forms oil-based ink-receptive areas having an oleophilic surface. At the same time, in unexposed areas, the uncured image recording layer is dissolved or dispersed and removed by the aqueous component and/or oil-based ink supplied, revealing the hydrophilic surface of the plate in those areas.

As a result, the aqueous component adheres to the now uncovered hydrophilic surfaces, the oil-based ink deposits on the light-exposed areas of the image recording layer, and printing begins. Either the aqueous component or the oil-based ink may be supplied first to the plate surface, although it is preferable to initially supply the oil-based ink in order to prevent the aqueous component from being contaminated by the image recording layer in unexposed areas of the plate. The aqueous component and the oil-based ink are generally dampening water and oil-based printing ink.

In this way, the presensitized plate is developed on an offset printing press, then used directly in this developed state to print a large number of impressions.

In the lithographic printing method of the present invention, because the inventive presensitized plate which uses a specific infrared absorber is developed on press, the presensitized plate has an excellent sensitivity and the lithographic printing plate has an outstanding press life.

This application claims priority on Japanese patent applications No.2003-85166, No.2003-327659 and No.2003-341197, the contents of which are hereby incorporated by reference. In addition, the contents of literatures cited herein are incorporated by reference.

EXAMPLES

Examples are given below by way of illustration, although the present invention is not limited by these examples.

1-1. Fabrication of Presensitized Plate (1) Production of Support:

An aluminum sheet was produced as follows. A melt of JIS A1050 aluminum alloy composed of 99.5 wt % or more aluminum, 0.30 wt % iron, 0.10 wt % silicon, 0.02 wt % titanium and 0.013 wt % copper with the balance being inadvertent impurities was subjected to cleaning treatment and cast. Cleaning treatment consisted of degassing treatment to remove unwanted gases such as hydrogen from the melt, followed by ceramic tube filtration. Casting was carried out by a direct chill casting process. The solidified ingot having a thickness of 500 mm was faced, removing 10 mm of material from the surface, then subjected to 10 hours of homogenizing treatment at 550° C. to prevent coarsening of the intermetallic compounds. Next, the ingot was hot rolled at 400° C. and intermediate annealed in a continuous annealing furnace at 500° C. for 60 seconds, then cold rolled to form a sheet of rolled aluminum having a thickness of 0.30 mm. The centerline average roughness $R_a$ after cold rolling was controlled to 0.2 μm by controlling the roughness of the rolls used in this process. The rolled aluminum was then passed through a tension leveler to improve flatness, and the resulting aluminum sheet was surface treated as described below.

First, to remove rolling oils from the surface of the aluminum sheet, degreasing treatment was carried out at 50° C. for 30 seconds using a 10 wt % aqueous solution of sodium aluminate. Neutralization and desmutting were then carried out with a 30 wt % aqueous solution of sulfuric acid at 50° C. for 30 seconds.

Next, graining treatment was administered to improve adhesion between the image recording layer and the support and to confer the non-image areas with water-retaining properties. Specifically, electrochemical graining treatment was carried out by an electrolytic process that consisted of passing the aluminum sheet as a web through an aqueous solution (solution temperature, 45° C.) containing 1 wt % nitric acid and 0.5 wt % aluminum nitrate supplied to an indirect current supply cell, while at the same time applying 240 C/dm$^2$ of electricity to the aluminum sheet as the anode at a current density of 20 A/dm$^2$ and as an alternating waveform having a duty ratio of 1/1.

Moreover, etching treatment was carried out using a 10 wt % aqueous solution of sodium hydroxide at 35° C. for 30 seconds, following which neutralization and desmutting were administered using 30 wt % aqueous sulfuric acid at 50° C. for 30 seconds.

Anodizing treatment was then carried out so as to improve the wear resistance, chemical resistance and water retention. This consisted of administering electrolytic treatment to a web of the aluminum sheet with direct current at a current density of 14 A/dm$^2$ while passing the sheet through 20 wt % aqueous sulfuric acid (solution temperature, 35° C.) supplied to an indirect current supply cell, thereby forming on the aluminum sheet a 2.5 g/m$^2$ anodized layer.

Next, to ensure the hydrophilic properties of non-image areas, the aluminum sheet was silicate-treated using a 1.5 wt % aqueous solution of No. 3 sodium silicate at 70° C. for 15 seconds. The amount of silicon deposited was 10 mg/m$^2$. The treated sheet was then rinsed with water, giving the finished support. The support thus obtained had a centerline average roughness $R_a$ of 0.25 μm.

(2) Formation of Image Recording Layer:

Example 1-1

Next, an image recording layer-forming coating liquid A of the composition indicated below was prepared. Immediately following preparation, the coating liquid was applied with a wire bar to the support obtained as described above, then dried at 115° C. for 45 seconds using a hot air drier, thereby forming an image recording layer and completing production of a negative-type presensitized plate P-1. The coating amount, after drying, was 1.0 g/m$^2$. Composition of Image Recording Layer-Forming Coating liquid A:

| | |
|---|---|
| Infrared absorber (IR-2 in the first aspect) | 0.05 g |
| Radical generator (OS-7 above) | 0.2 g |
| Monomer compound of the following formula below | 1.3 g |

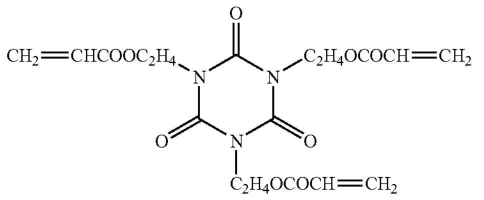

| | |
|---|---|
| Poly (allyl methacrylate) (weight-average molecular weight, 120,000) | 0.5 g |
| Victoria Pure Blue, naphthalenesulfonate | 0.02 g |
| Fluorine containing surfactant of the following formula | 0.1 g |

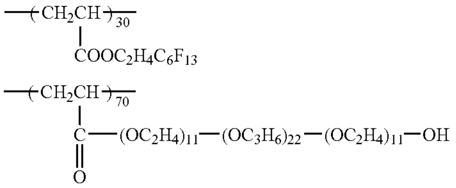

| | |
|---|---|
| Methyl ethyl ketone | 18.0 g |

Examples 1-2 to 1-7

Aside from changing the types of infrared absorber and radical generator used in the respective examples to those shown in Table 1, negative-type presensitized plates P-2 to P-7 were obtained in the same way as in Example 1-1.

Example 1-8

Aside from using a copolymer of allyl methacrylate and sodium methacrylate (molar ratio, 80:20) instead of poly (allyl methacrylate), a negative-type presensitized plate P-8 was obtained in the same way as in Example 1-1.

Example 1-9

Aside from using dipentaerythritol hexaacrylate instead of the monomer compound of the above formula, a negative-type presensitized plate P-9 was obtained in the same way as in Example 1-2.

Comparative Example 1-1

Aside from changing the infrared absorber used to IR-786 having the following formula, a negative-type presensitized plate P-10 was obtained in the same way as in Example 1-1.

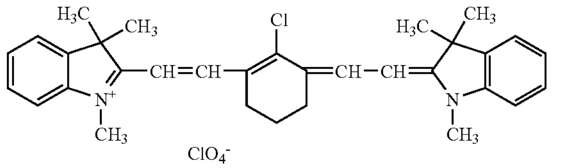

IR-786 perchlorate

Example 1-10

An image recording layer-forming coating liquid B of the following composition was prepared. The coating liquid was applied with a wire bar onto the support obtained as described above and dried in an oven at 70° C. for 60 seconds, thereby forming an image recording layer and completing production of a negative-type presensitized plate P-11. The coating amount, after drying, was 1.0 g/m$^2$.

| Composition of Image Recording Layer-Forming Coating liquid B: | |
|---|---|
| Water | 95 g |
| Microcapsule liquid (see below) | 5 g (solids only) |
| Ethoxylated trimethylolpropane triacrylate (SR9035 prepared by Nippon Kayaku Co., Ltd.; number of moles of ethylene oxide added, 15; molecular weight, 1000) | 0.2 g |
| Radical generator (OS-7 above) | 0.5 g |
| Infrared absorber IR-36 of the following formula | 0.15 g |
| Ethylene glycol | 0.1 g |
| Fluorine-containing surfactant (Megaface F-171; made by Dainippon Ink & Chemicals, Inc.) | 0.1 g |

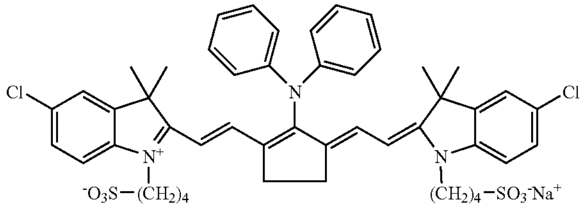

Microcapsule Liquid:

An oil phase component was prepared by dissolving 10 g of trimethylolpropane-xylylene diisocyanate adduct (Takenate D-110N, produced by Mitsui Takeda Chemicals, Inc.), 3.15 g of pentaerythritol triacrylate (SR444, produced by Nippon Kayaku Co., Ltd.), 0.35 g of the infrared absorber IR-37 having the following formula, 1 g of 3-(N,N-diethylamino)-6-methyl-7-anilinofluoran (ODB, made by Yamamoto Chemicals, Inc.) and 0.1 g of surfactant (Pionin A-41C, made by Takemoto Oil & Fat Co., Ltd.) in 17 g of ethyl acetate. An aqueous phase component was obtained by preparing 40 g of an aqueous solution containing 4 wt % of polyvinyl alcohol (PVA-205, made by Kuraray Co., Ltd.). The oil phase component and aqueous phase component were mixed and emulsified using a homogenizer at 12,000 rpm for 10 minutes. The resulting emulsion was added to 25 g of distilled water, following which the mixture was stirred, first at room temperature for 30 minutes, then at 40° C. for 3 hours. The mixture was then diluted with distilled water so as to form a microcapsule.liquid having a solids concentration of 20 wt %. The microcapsules had an average particle size of 0.3 μm.

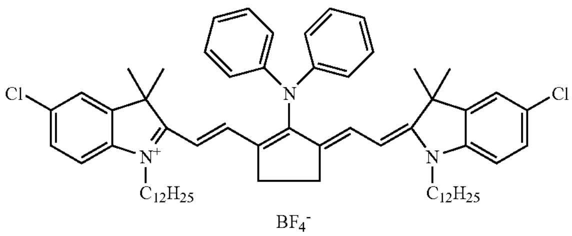

1-2. Exposure and Printing

The resulting presensitized plate was exposed using a Trendsetter 3244 VX (Creo Inc.) equipped with a water-cooled 40 W infrared semiconductor laser at an output of 9 W, an external drum speed of 210 rpm, and a resolution of 2,400 dpi. A line chart was included in the exposure image. The exposed presensitized plate was mounted on the plate cylinder of a SOR-M printing press (Heidelberger Druckmaschinen AG) without first being subjected to development. Using dampening water (EU-3 (an etchant produced by Fuji Photo Film Co., Ltd.)/water/isopropyl alcohol=1/89/10 by volume) and TRANS-G (N) India ink (Dainippon Ink and Chemicals, Inc.), first dampening water and ink were supplied to the plate, following which 100 impressions were printed at a press speed of 6,000 impressions per hour.

The on-machine developability was measured as the number of sheets of printing paper required until on-machine development of unexposed areas of the image recording layer reached completion on the press and ink from non-image areas ceased to be transferred to the printing paper. With each of the presensitized plates used, impressions free of contamination in non-image areas were obtained in less than 100 sheets.

1-3. Evaluation

Generally, in the case of negative-type presensitized plates, a lower exposure dosage results in a lower degree of cure by the image recording layer (photosensitive layer), and a higher exposure dose results in a higher degree of cure. If the degree of cure by the image recording layer is too low, the presensitized plate has a low press life, in addition to the poor reproduction of dots and fine lines. On the other hand, when the image recording layer has a high degree of cure, the presensitized plate has a longer press life and provides good dot and fine line reproduction.

As indicated below, the press life and fine line reproduction of the negative-type presensitized plates P-1 to P-11 obtained in the present examples were evaluated under the same exposure dose conditions as mentioned above. These results were used as indicators of the sensitivity of the presensitized plates. That is, a presensitized plate can be said to have a higher sensitivity the higher the number of impressions in its press life and the smaller the line width in the fine line reproduction results.

(1) Fine Line Reproduction:

After printing 100 impressions and confirming, as noted above, that impressions were obtained which were free of ink contamination in non-image areas, the print run was continued for another 500 impressions. The line charts (charts in which fine lines having widths of 10, 12, 14, 16, 18, 20, 25, 30, 35, 40, 60, 80, 100 and 200 μm were exposed)

on the total of 600 impressions were examined with a 25× magnifier and the fine line reproduction was rated based on the widths of the fine lines that were reproduced in ink without any breaks. The results are shown in Table 1 below.

(2) Press Life:

After carrying out printing as described above to evaluate the fine line reproduction, the printing run was continued further. As the number of impressions rises, the image recording layer gradually undergoes wear and ink receptivity declines, leading to a decrease in the ink density on the printing paper. The press life was evaluated based on the number of impressions that had been printed when the ink density (reflection density) decreased 0.1 from the start of printing. The results are shown in Table 1 below.

As is apparent from Table 1, when the lithographic printing method of the present invention was carried out using the presensitized plate of the first aspect of the present invention (Examples 1-1 to 1-10), the fine line reproduction and press life were both far better than when a prior-art presensitized plate was used (Comparative Example 1-1).

TABLE 1

| | Pre-sensitized plate | Infrared absorbent | Radical generator | Fine line reproduction (μm) | Press life (1,000s of impressions) |
|---|---|---|---|---|---|
| Example 1-1 | P-1 | IR-2 in the first aspect | OS-7 | 10 | 50 |
| Example 1-2 | P-2 | IR-5 in the first aspect | OS-7 | 10 | 50 |
| Example 1-3 | P-3 | IR-10 in the first aspect | OS-7 | 10 | 50 |
| Example 1-4 | P-4 | IR-16 in the first aspect | OS-7 | 20 | 40 |
| Example 1-5 | P-5 | IR-2 in the first aspect | OS-1 | 16 | 40 |
| Example 1-6 | P-6 | IR-2 in the first aspect | OI-5 | 16 | 35 |
| Example 1-7 | P-7 | IR-2 in the first aspect | ON-1 | 16 | 35 |
| Example 1-8 | P-8 | IR-2 in the first aspect | OS-7 | 25 | 20 |
| Example 1-9 | P-9 | IR-5 in the first aspect | OS-7 | 10 | 35 |
| Comp. Ex. 1-1 | P-10 | IR-786 | OS-7 | 40 | 10 |
| Example 1-10 | P-11 | IR-36 IR-37 | OS-7 | 16 | 30 |

2-1. Fabrication of Presensitized Plate (1) Production of Support:

A support was obtained in the same way as in the above sub-section entitled "(1) Production of Support" of section "1-1. Fabrication of Presensitized Plate."

(2) Formation of Image Recording Layer:

Example 2-1

An image recording layer-forming coating fluid (1) of the composition indicated below was bar-coated onto the support obtained as described above. The fluid was then oven-dried at 80° C. for 60 seconds, thereby forming an image recording layer having a dry coating weight of 0.7 g/$m^2$ and completing production of a presensitized plate 1.

| Composition of Image Recording Layer-Forming Coating Fluid (1): | |
|---|---|
| Infrared absorber (IR-1 according to second aspect of invention above) | 0.05 g |
| Radical generator (OS-6 above) | 0.2 g |
| Binder polymer (1) of following formula (average molecular weight, 80,000) | 0.5 g |
| Polymerizable compound (NK Ester M-315, a tris (2-hydroxyethyl) isocyanurate triacrylate produced by Shin-Nakamura Chemical Co., Ltd.) | 1.0 g |
| Nonionic surfactant (Emulgen 147, Kao Corporation) | 0.2 g |
| Fluorine-containing surfactant (1) of the following formula | 0.1 g |
| Methyl ethyl ketone | 18.0 g |

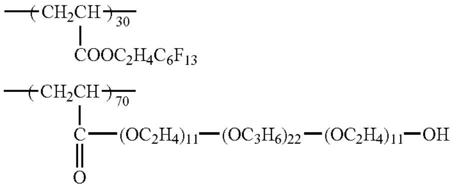

FLUORINE - CONTAINING SURFACTANT (1)

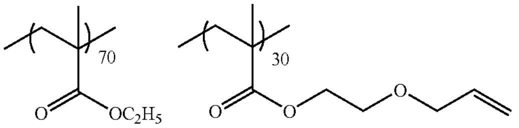

BINDER POLYMER (1)

Examples 2-2 and 2-3

Aside from changing the infrared absorber and radical generator as shown in Table 2, presensitized plates 2 and 3 were obtained in the same way as in Example 2-1.

Example 2-4

An undercoat layer-forming coating fluid (1) of the following composition was bar-coated onto the above-described support in a fluid amount of 7.5 mL/$m^2$, following which the fluid-coated support was dried in an oven at 80° C. for 10 seconds. An image recording layer-forming coating fluid was then applied in the same way as in Example 2-3, thereby forming a presensitized plate 4.

| Composition of Undercoat Layer-Forming Coating Fluid (1): | |
|---|---|
| Water | 15 g |
| Methanol | 135 g |
| Compound A of the following formula | 0.72 g |

COMPOUND A

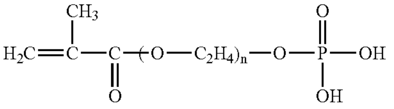

n = 4-5

Example 2-5

Aside from using a copolymer of allyl methacrylate and sodium methacrylate (molar ratio, 80:20) in the image recording layer instead of binder polymer (1), an undercoat layer and an image recording layer were applied in order by the same method as in Example 2-4, thereby giving a presensitized plate 5.

Example 2-6

An image recording layer-coating fluid (2) of the composition shown below was bar-coated onto the above-described support and dried in an oven at 80° C. for 60 seconds to form an image recording layer having a dry coated weight of 0.3 $g/m^2$. Next, another coat was applied thereon by bar-coating an image recording layer-coating fluid (3) of the composition shown below in an amount such as to give a dry coated weight of 0.4 $g/m^2$, and drying in an oven at 80° C. for 60 seconds, thereby completing fabrication of a presensitized-plate 6.

| Composition of Image Recording Layer-Forming Coating Fluid (2): | |
|---|---|
| Water | 100 g |
| Microcapsule solution described above | 5 g (solids basis) |
| Radical generator (OS-7 above) | 0.5 g |
| Fluorine-containing surfactant (1) described above | 0.2 g |
| **Composition of Image Recording Layer-Forming Coating Fluid (3):** | |
| Infrared absorber (IR-8 according to second aspect of invention above) | 0.05 g |
| Radical generator (OS-7 above) | 0.2 g |
| Binder polymer (1) of the above formula (average molecular weight, 80,000) | 0.5 g |
| Polymerizable compound (NK Ester M-315, a tris (2-hydroxyethyl) isocyanurate triacrylate, produced by Shin-Nakamura Chemical Co., Ltd.) | 1.0 g |
| Nonionic surfactant (Emulgen 147, Kao Corporation) | 0.2 g |
| Fluorine-containing surfactant (1) of the above formula | 0.1 g |
| Methyl ethyl ketone | 18.0 g |

Example 2-7

An image recording layer-coating fluid (1) of the above composition was bar-coated in a liquid amount of 7.5 $mL/m^2$ onto the above-described support, and dried in an oven at 80° C. for 10 seconds. Another image-recording layer was then formed thereon in the same way as in Example 2-6, thereby completing fabrication of a presensitized plate 7.

Examples 2-8 and 2-9

Aside from changing the infrared absorber and radical generator used in the image recording layer-forming coating fluid (3) to those shown in Table 2, presensitized plates 8 and 9 were obtained by the same method as in Example 2-7.

Comparative Example 2-1

Aside from changing the infrared absorber and radical generator to those shown in Table 2, a comparative presensitized plate 1 was obtained in the same way as in Example 2-1. The oxidation potential of IR-786 was 0.49 V (vs. SCE).

Comparative Example 2-2

Aside from excluding the infrared absorber used in preparing microcapsule liquid, and changing the infrared absorber and radical generator used in image recording layer-forming coating fluid (3) to those shown in Table 2, a comparative presensitized plate 2 was obtained in the same way as in Example 2-7.

2-2. Exposure and Printing

The resulting presensitized plate was exposed using a Trendsetter 3244 VX (Creo Inc.) equipped with a water-cooled 40 W infrared semiconductor laser at an output of 9 W, an external drum speed of 210 rpm, and a resolution of 2,400 dpi. A line chart was included in the exposure image. The exposed presensitized plate was mounted on the plate cylinder of a SOR-M printing press (Heidelberger Druckmaschinen AG) without first being subjected to development. Using dampening water (EU-3 (an etchant produced by Fuji Photo Film Co., Ltd.)/water/isopropyl alcohol=1/89/10 by volume) and TRANS-G (N) India ink (Dainippon Ink and Chemicals, Inc.), first dampening water and ink were supplied to the plate, following which 200 impressions were printed at a press speed of 6,000 impressions per hour.

The on-machine developability was measured as the number of sheets of printing paper required until on-machine development of unexposed areas of the image recording layer reached completion on the press and ink from non-image areas ceased to be transferred to the printing paper. With each of the presensitized plates used, impressions free of contamination in non-image areas were obtained in less than 200 sheets.

2-3. Evaluation

After checking that development on the printing press was complete, printing was continued. As the number of impressions printed increased, the image recording layer gradually wore away, becoming less receptive to the ink. As a result, the ink density on the printing paper decreased. The press life was evaluated based on the number of impressions that had been printed when the ink density (reflection density) decreased 0.1 from the start of printing. The results are shown in Table 2 below.

TABLE 2

| | Infrared absorbent | Radical generator | Press life (1,000s of impressions) |
|---|---|---|---|
| Example 2-1 | IR-1 in the second aspect | OS-6 | 25 |
| Example 2-2 | IR-5 in the second aspect | OI-5 | 20 |
| Example 2-3 | IR-8 in the second aspect | OS-7 | 25 |
| Example 2-4 | IR-8 in the second aspect | OS-7 | 35 |
| Example 2-5 | IR-8 in the second aspect | OS-7 | 15 |
| Example 2-6 | IR-8 in the second aspect | OS-7 | 20 |
| Example 2-7 | IR-8 in the second aspect | OS-7 | 30 |
| Example 2-8 | IR-5 in the second aspect | OI-5 | 25 |
| Example 2-9 | IR-10 in the second aspect | OS-4 | 20 |
| Comp. Ex. 2-1 | IR-786 | OI-5 | 2 |
| Comp. Ex. 2-2 | IR-786 | OS-4 | 2 |

From Table 2, it is apparent that lithographic printing plates having an exceptional press life can be obtained by using presensitized plates according to the second aspect of the present invention (Examples 2-1 to 2-9).

What is claimed is:

1. A presensitized plate comprised of a support having thereon, in order:

an undercoat layer containing a compound having a polymerizable group on the molecule, wherein the compound having a polymerizable group on the molecule also has on the molecule an ethylene oxide group; and an image recording layer which includes: an infrared absorber (A) that is a cyanine dye having at least one fused ring comprised of a nitrogen-containing heterocycle in combination with an aromatic ring or a second heterocycle, and having on the aromatic ring or second heterocycle an electron-withdrawing group or a heavy atom-containing group, a radical generator (B), and a radical-polymerizable compound (C), and which is removable with printing ink and/or dampening water.

2. The presensitized plate according to claim 1, wherein the infrared absorber (A) is a compound of formula (I ) below:

(1)

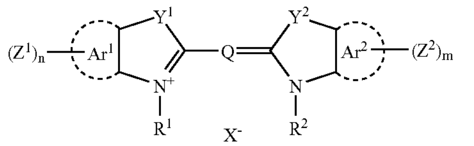

wherein in the formula (1), $R^1$ and $R^2$ are each independently a hydrocarbon group of up to 20 carbons which may be substituted, $Ar^1$ and $Ar^2$ are each independently an aromatic hydrocarbon group or a heterocyclic group which may be substituted, $Y^1$ and $Y^2$ are each independently a Sulfur atom, an oxygen atom, a selenium atom, a dialkylmethylene group of up to 12 carbons or a —CH═CH— group, $Z^1$ and $Z^2$ are each substituents selected from the group consisting of hydrocarbon groups, oxy groups, electron-withdrawing groups and heavy atom-containing groups, at least one of $Z^1$ and $Z^2$ being an electron-withdrawing group or a heavy atom-containing group, wherein the letters n and m each represent 0 or a higher integer, with the proviso that the sum of n and m is at least 1, Q is a pentamethine group or a heptamethine group which may be substituted with a member selected from the group consisting of alkoxy, aryloxy, alkylthio, arylthio, dialkylamino, diarylamino, halogen atoms, alkyl, aralkyl, cycloalkyl, aryl, oxy, iminium bases and substituents of formula (2) below; or may have a cyclohexene, cyclopentene or cyclobutene ring containing three connected methine chains, (2)

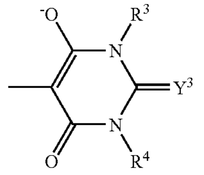

wherein in the formula (2), $R^3$ and $R^4$ are each independently a hydrogen atom, an alkyl of 1 to 8 carbons or an aryl of 6 to 10 carbons; and $Y^3$ is an oxygen atom or a sulfur atom, and $X^-$ is a counteranion that exists in cases where charge neutralization is required.

3. The presensilized plate according to claim 2, wherein the infrared absorber (A) has an oxidation potential of at most 0.45 V (vs. SCE).

* * * * *